United States Patent
Dimmler et al.

(10) Patent No.: US 6,714,435 B1
(45) Date of Patent: Mar. 30, 2004

(54) FERROELECTRIC TRANSISTOR FOR STORING TWO DATA BITS

(75) Inventors: Klaus Dimmler, Co. Springs, CO (US); Alfred P. Gnadinger, Co. Springs, CO (US)

(73) Assignee: Cova Technologies, Inc., Colorado Springs, CO (US)

(*) Notice: Subject to any disclaimer, the term of this patent is extended or adjusted under 35 U.S.C. 154(b) by 0 days.

(21) Appl. No.: 10/246,975

(22) Filed: Sep. 19, 2002

(51) Int. Cl.[7] ............................................... G11C 11/22
(52) U.S. Cl. ....................................................... 365/145
(58) Field of Search ......................................... 365/145

(56) References Cited

U.S. PATENT DOCUMENTS

| | | |
|---|---|---|
| 3,832,700 A | 8/1974 | Wu et al. |
| 4,860,254 A | 8/1989 | Pott et al. |
| 5,046,043 A | 9/1991 | Miller et al. |
| 5,060,191 A | 10/1991 | Nagasaki et al. |
| 5,070,385 A | 12/1991 | Evans, Jr. et al. |
| 5,146,299 A | 9/1992 | Lampe et al. |
| 5,198,994 A | 3/1993 | Natori |
| 5,227,855 A | 7/1993 | Momose |
| 5,302,842 A | 4/1994 | Chan |
| 5,307,305 A | 4/1994 | Takasu |
| 5,345,414 A | 9/1994 | Nakamura |
| 5,365,094 A | 11/1994 | Takasu |
| 5,378,905 A | 1/1995 | Nakamura |
| 5,384,729 A | 1/1995 | Sameshima |
| 5,418,389 A | 5/1995 | Watanabe |
| 5,434,811 A | 7/1995 | Evans, Jr. et al. |
| 5,479,317 A | 12/1995 | Ramesh |
| 5,515,311 A | 5/1996 | Mihara |
| 5,519,235 A | 5/1996 | Ramesh |
| 5,523,964 A | 6/1996 | McMillan et al. |
| 5,536,672 A | 7/1996 | Miller et al. |
| 5,541,870 A | 7/1996 | Mihara et al. |
| 5,541,871 A | 7/1996 | Nishimura et al. |
| 5,541,873 A | 7/1996 | Nishimura et al. |
| 5,559,733 A | 9/1996 | McMillan et al. |
| 5,563,081 A | 10/1996 | Ozawa |
| 5,578,846 A | 11/1996 | Evans, Jr. et al. |
| 5,621,681 A | 4/1997 | Moon |
| 5,623,439 A | 4/1997 | Gotoh et al. |

(List continued on next page.)

FOREIGN PATENT DOCUMENTS

JP 408055919 A 2/1996

OTHER PUBLICATIONS

Tokumitsu, Eisuke et al, "Characterizaion of MF(M)S structures using P(L)ZT and $Y_2O_3$ films", Jpn. J. of Appl.Phys., vol. 39, Sep. 2000, pp. 5456–5459.

Tokumitsu, Eisuke et al, "Preparation of STN films by the sol–gel method for ferroelectric gate structures", IMF–10 Madrid/Spain (2001), pp. 105–110.

(List continued on next page.)

Primary Examiner—VanThu Nguyen
(74) Attorney, Agent, or Firm—Peter J. Meza; William J. Kubida; Hogan & Hartson LLP

(57) ABSTRACT

A method of storing and accessing two data bits in a single ferroelectric FET includes selectively polarizing two distinct ferroelectric regions in the same gate dielectric layer separated by a non-ferroelectric dielectric region. A first ferroelectric region is sandwiched between the substrate and the gate terminal in the region of the source and is polarized in one of two states to form a first data bit within the FET. A second ferroelectric region is sandwiched between the substrate and the gate terminal in the region of the drain and is polarized in one of two states to form a second data bit within the FET. Detection of the first data bit is accomplished by selectively applying a read bias to the FET terminals, a first current resulting when a first state is stored and a second current resulting when a second state is stored. The polarization of the second data bit is accomplished by reversing the source and drain voltages.

6 Claims, 22 Drawing Sheets

U.S. PATENT DOCUMENTS

| | | | |
|---|---|---|---|
| 5,640,030 A | * | 6/1997 | Kenney ..................... 257/296 |
| 5,736,759 A | | 4/1998 | Haushalter |
| 5,739,563 A | | 4/1998 | Kawakubo et al. |
| 5,744,374 A | | 4/1998 | Moon |
| 5,757,042 A | | 5/1998 | Evans, Jr. et al. |
| 5,768,185 A | | 6/1998 | Nakamura et al. |
| 5,780,886 A | | 7/1998 | Yamanobe et al. |
| 5,789,775 A | | 8/1998 | Evans, Jr. et al. |
| 5,808,676 A | | 9/1998 | Biegelsen et al. |
| 5,822,239 A | | 10/1998 | Ishihara et al. |
| 5,825,317 A | | 10/1998 | Anderson et al. |
| 5,858,533 A | | 1/1999 | Greuter et al. |
| 5,872,739 A | | 2/1999 | Womack |
| 5,877,977 A | | 3/1999 | Essaian |
| 5,886,920 A | | 3/1999 | Marshall et al. |
| 5,887,117 A | | 3/1999 | Desu et al. |
| 5,919,515 A | | 7/1999 | Yano et al. |
| 5,946,224 A | | 8/1999 | Nishimura |
| 5,953,061 A | | 9/1999 | Biegelsen et al. |
| 5,955,213 A | | 9/1999 | Yano et al. |
| 5,959,879 A | | 9/1999 | Koo |
| 5,962,884 A | | 10/1999 | Hsu et al. |
| 5,977,577 A | | 11/1999 | Evans, Jr. |
| 5,998,819 A | | 12/1999 | Yokoyama et al. |
| 6,025,735 A | | 2/2000 | Gardner et al. |
| 6,027,947 A | | 2/2000 | Evans et al. |
| 6,031,754 A | | 2/2000 | Derbenwick et al. |
| 6,066,868 A | | 5/2000 | Evans, Jr. |
| 6,067,244 A | | 5/2000 | Ma et al. |
| 6,069,381 A | | 5/2000 | Black et al. |
| 6,087,688 A | | 7/2000 | Furuta et al. |
| 6,091,621 A | | 7/2000 | Wang et al. |
| 6,104,049 A | | 8/2000 | Solayappan et al. |
| 6,121,648 A | | 9/2000 | Evans, Jr. |
| 6,130,103 A | | 10/2000 | Cuchiaro et al. |
| 6,140,672 A | | 10/2000 | Arita et al. |
| 6,144,579 A | | 11/2000 | Taira |
| 6,147,895 A | | 11/2000 | Kamp |
| 6,150,184 A | | 11/2000 | Evans et al. |
| 6,151,241 A | | 11/2000 | Hayashi et al. |
| 6,151,242 A | | 11/2000 | Takashima |
| 6,165,802 A | | 12/2000 | Cuchiaro et al. |
| 6,171,934 B1 | | 1/2001 | Joshi et al. |
| 6,194,751 B1 | | 2/2001 | Evans, Jr. |
| 6,201,731 B1 | | 3/2001 | Kamp et al. |
| 6,207,465 B1 | | 3/2001 | Cuchiaro et al. |
| 6,225,156 B1 | | 5/2001 | Cuchiaro et al. |
| 6,225,654 B1 | | 5/2001 | Evans, Jr. et al. |
| 6,225,656 B1 | | 5/2001 | Cuchiaro et al. |
| 6,236,076 B1 | | 5/2001 | Arita et al. |
| 6,245,451 B1 | | 6/2001 | Kamisawa et al. |
| 6,245,580 B1 | | 6/2001 | Solayappan et al. |
| 6,246,602 B1 | | 6/2001 | Nishimura |
| 6,255,121 B1 | | 7/2001 | Arita et al. |
| 6,256,220 B1 | | 7/2001 | Kamp |
| 6,285,577 B1 | | 9/2001 | Nakamura |
| 6,307,225 B1 | | 10/2001 | Kijima et al. |
| 6,310,373 B1 | | 10/2001 | Azuma et al. |
| 6,319,542 B1 | | 11/2001 | Summerfelt et al. |
| 6,322,849 B2 | | 11/2001 | Joshi et al. |
| 6,326,315 B1 | | 12/2001 | Uchiyama et al. |
| 6,335,550 B1 | | 1/2002 | Miyoshi et al. |
| 6,339,238 B1 | | 1/2002 | Lim et al. |
| 6,358,758 B2 | | 3/2002 | Arita et al. |
| 6,362,068 B1 | | 3/2002 | Summerfelt et al. |
| 6,365,927 B1 | | 4/2002 | Cuchiaro et al. |
| 6,370,056 B1 | | 4/2002 | Chen et al. |
| 6,372,518 B1 | | 4/2002 | Nasu et al. |
| 6,373,743 B1 | | 4/2002 | Chen et al. |
| 6,396,093 B1 | | 5/2002 | Nakamura |
| 6,396,095 B1 | | 5/2002 | Shimada et al. |
| 6,438,019 B2 | * | 8/2002 | Hartner et al. ............... 365/133 |
| 6,469,334 B2 | | 10/2002 | Arita et al. |
| 2002/0083959 A1 | | 7/2002 | Morita et al. |

OTHER PUBLICATIONS

Tokumitsu, Eisuke et al, "Electrical Properties of MFIS and MFMIS FETs using ferroelectric SBT film and STO/SiON buffer layer", Jpn. J. of Appl.Phys., vol. 39, Apr. 2000, pp. 2125–2130.

Shin, Chang Ho et al, "Fabrication and characterization of MFIS FET using $Al_2O_3$ insulating layer for nonvolative memory", ISIF 2001, 9 pages.

Lee, Ho Nyung et al., "CV characteristics of $Pt/SBT/CeO_2/Si$ structure for non volatile memory devices", ISIF, 4 pages.

Choi, Hoon Sang et al, "Crystal Structure and electrical properties of $Pt/SBT/ZrO_2/Si$", J. of Korean Phys. Soc., vol. 39, No. 1, Jul. 2001, pp. 179–183.

Li, W.P. et al, "Improvement of MFS structures without buffer layers between Si and ferroelectric film", Applied Physics A, Springer (2000), pp. 85–87.

Han, Jin–Ping et al, "Memory effects of SBT capacitors on silicon with silicon nitride buffer", Integrated Ferroelectrics, 1998, vol. 22, pp. 213–221.

Miller, S.L. and McWhorter, P.J., "Device Physics of the ferroelectric memory field effect transistor", ISIF Jun. 1992, pp. 5999–6010.

Kalkur, T.S., "Characteristics of MFS capacitors and MFSETs with $BaMgF_4$ gate dielectrics", ISIF 1992, 1 page.

Wu, S.Y., IEEE Trans.Electron Devices ED 21, 499 (1974). An excellent review article referencing the same work was published in 1992 by Sinharoy, S. et al, "Integration of ferroelectric thin films into nonvolatile memories", J. Vac.Sci.Technol.A 10(4), Jul./Aug. 1992, pp. 1554–1561.

Chung, Ilsub et al., "Data Retention: Fabrication and characterization of MFISFET using CMOS process for single transistor memory applications", Integrated Ferroelectrics, 1999, vol. 27, pp. 31–39.

Miller, S.L. and McWhorter, P.J., "Theoretical investigation of a ferroelectric transistor: Physics of the ferroelectric nonvolatile memory field effect transistor", J. Appl.Phys. 72 (12), Sep. 9, 1992, pp. 5999–6010.

Smyth, D.M., "Charge Motion in ferroelectric thin films", Ferroelectrics, vol. 116, pp. 117–124 (1991), pp. 117–124.

Wu, S.Y. "A ferroelectric memory device, Metal–Ferroelectric–Semiconductor Transistor", IEEE Trans.Electron Devices, vol. ED–21, No. 8, Aug. 1994, pp. 499–504.

Moshnayaga, V. et al., "Preparation of rare–earth manganite–oxide thin films by metalorganic aerosol deposition technique", Appl. Phys. Lett., vol. 74, No. 19, pp 2842–2844 (1998).

Kim, Kwang–Ho, "Metal–Ferroelectric—Semiconductor (MFS) FET's using $LiNbO3/Si$ (100) Structures for non-volatile memory applications", IEEE Electron Device Letters, vol. 19, No. 6, pp. 204–206 (Jun. 1998).

* cited by examiner

FERROELECTRIC TRANSISTOR FOR STORING TWO DATA BITS

FIELD OF THE INVENTION

The invention disclosed relates generally to memory cells, and more particularly to ferroelectric nonvolatile memory cells.

BACKGROUND OF THE INVENTION

Ferroelectric transistors are structurally identical to metal-oxide-silicon field effect transistor (MOSFET) devices with the gate oxide layer replaced by a ferroelectric material layer 12, as shown in FIG. 1. The polarization state of the ferroelectric material layer 12 gives rise to an electric field, which shifts the turn-on threshold voltage of the device 10. Transistors known in the prior art often include a non-ferroelectric dielectric layer 16 between the ferroelectric material and the silicon substrate 18, as shown in the device 14 of FIG. 2. This dielectric layer 16 generally has several purposes at the silicon/ferroelectric interface including avoidance of uncontrolled growth of silicon dioxide, avoidance of high electric fields at the interface, separating the ferroelectric materials from the silicon, avoidance of crystal lattice structure mismatch between the silicon and the ferroelectric materials, and keeping hydrogen away from the ferroelectric materials. Such a dielectric layer 16 is sometimes also placed between the top electrode layer 20 and the ferroelectric layer 12 for the same reasons. These devices, such as devices 10 and 14 and variants thereof, are utilized in arrays of rows and columns to form one-transistor ("1T") non-volatile ferroelectric memories.

When a voltage greater than a coercive voltage is applied across the ferroelectric material, the ferroelectric material polarizes in the direction aligning with the electric field. When the applied voltage is removed, the polarization state is preserved. When a voltage greater than the coercive voltage is applied to the ferroelectric material in the opposite direction, the polarization in the ferroelectric material reverses. When that electric field is removed, the reversed polarization state remains in the material. The electric field generated by the polarization offsets the natural turn-on threshold of the transistors, effectively shifting the turn-on thresholds of the transistors. By applying known voltages less than the coercive voltage on the terminals of the transistor, the state of the polarization within the ferroelectric material can be detected without altering the stored polarization states, a method known in the prior art as non-destructive read-out.

These devices are generally electrically connected in an array of rows and columns with common row signals and column signals to form a memory array. A common figure of merit to establish manufacturing costs of these memory arrays is the area utilized per data bit. When utilized in an array of this type, many prior art configurations require additional transistors to provide for the selection of a single device within the array.

What is desired, therefore, is a minimum area ferroelectric non-volatile memory cell structure and a method of biasing such that a single one-transistor memory cell capable of storing two data bits can be written to and accessed without disturbing other cells within an array.

SUMMARY OF THE INVENTION

According to principles of the present invention, a novel apparatus and method of storing and accessing two bits in a single ferroelectric FET (field effect transistor) exhibiting hysteresis, each FET having gate, source, and drain, terminals and a substrate is disclosed. Ferroelectric material sandwiched between the substrate and the gate terminal in the region of the source is polarized in one of two states to form a first data bit within the FET. Ferroelectric material sandwiched between the substrate and the gate terminal in the region of the drain is polarized in one of two states to form a second data bit within the FET. Non-ferroelectric dielectric is sandwiched between the substrate and the gate terminals in regions between the ferroelectric material in the source region and the ferroelectric material in the drain region. The polarization of the ferroelectric material in the source region changes the threshold voltage of the FET regardless of the polarization state in the drain region. Accordingly, the detection of the first data bit, determined by the polarization state of the material in the source region, is accomplished by applying a read bias to the FET terminals, a first current resulting when a first state is stored and a second current resulting when a second state is stored. The polarization of the second data bit is accomplished by reversing the source and drain voltages. The FETs are electrically connected in an array of rows and columns, the gates of the FETs in a common row connected by a common word line, the sources of the FETs in a common column sharing a common bit line, the drains of the FETs in a common column sharing a common bit line, and the substrate of all FETs sharing a common substrate. Appropriate write voltage biasing of the word lines, bit lines, and substrate provides means for polarizing a single ferroelectric region of a single FET within the array, while leaving the polarization of all other ferroelectric regions unchanged. Appropriate read voltage biasing of the word lines, bit lines, and substrate provides means for detection of the polarization state of a single ferroelectric region of a single FET within the array, a first bit line current determining a first state and a second bit line current determining a second state.

The foregoing and other objects, features and advantages of the invention will become more readily apparent from the following detailed description of a preferred embodiment of the invention, which proceeds with reference to the accompanying drawings.

DETAILED DESCRIPTION OF THE INVENTION

Figure 1:
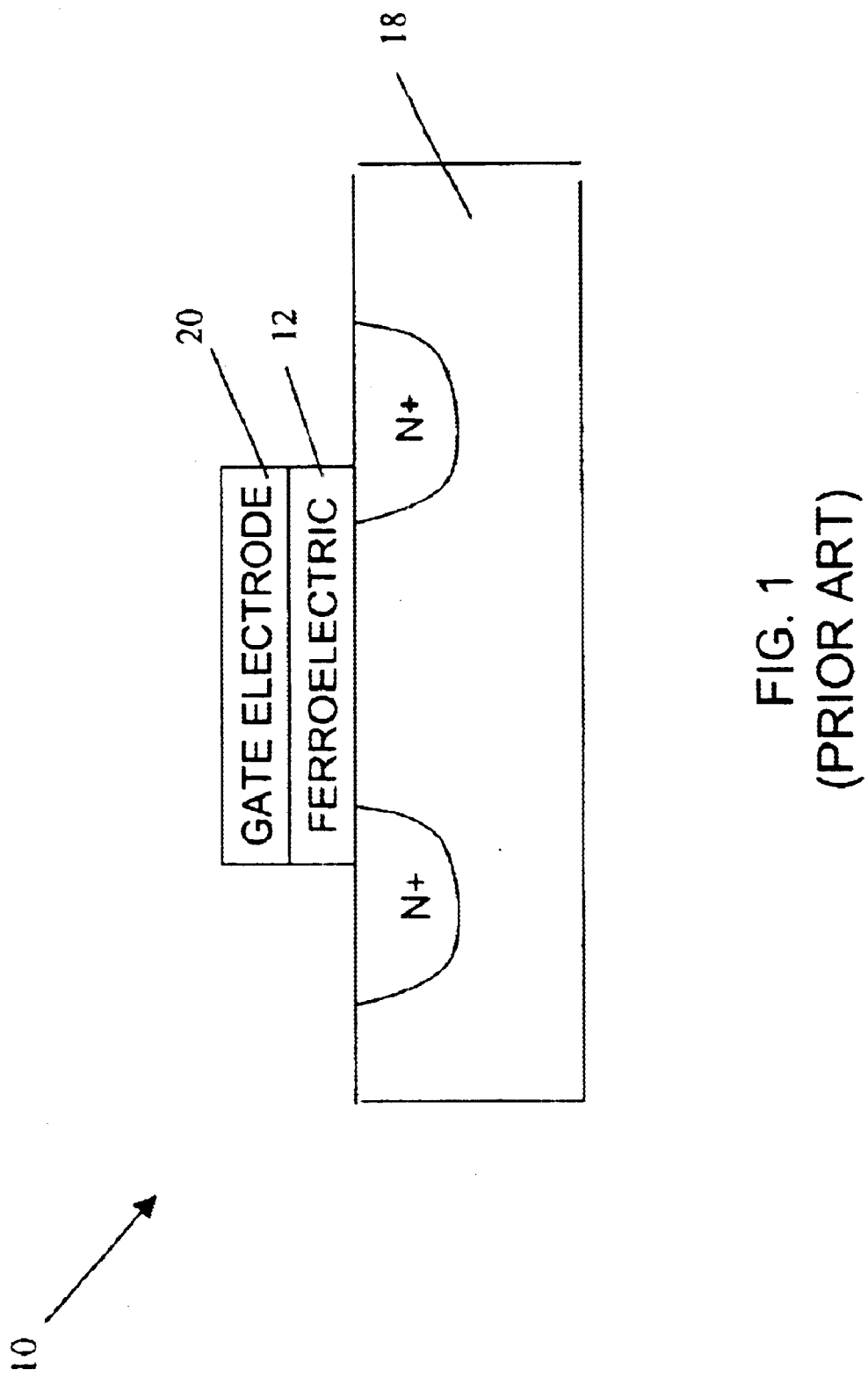
FIG. 1 is a cross section of a ferroelectric transistor as known in the prior art.
Figure 2:
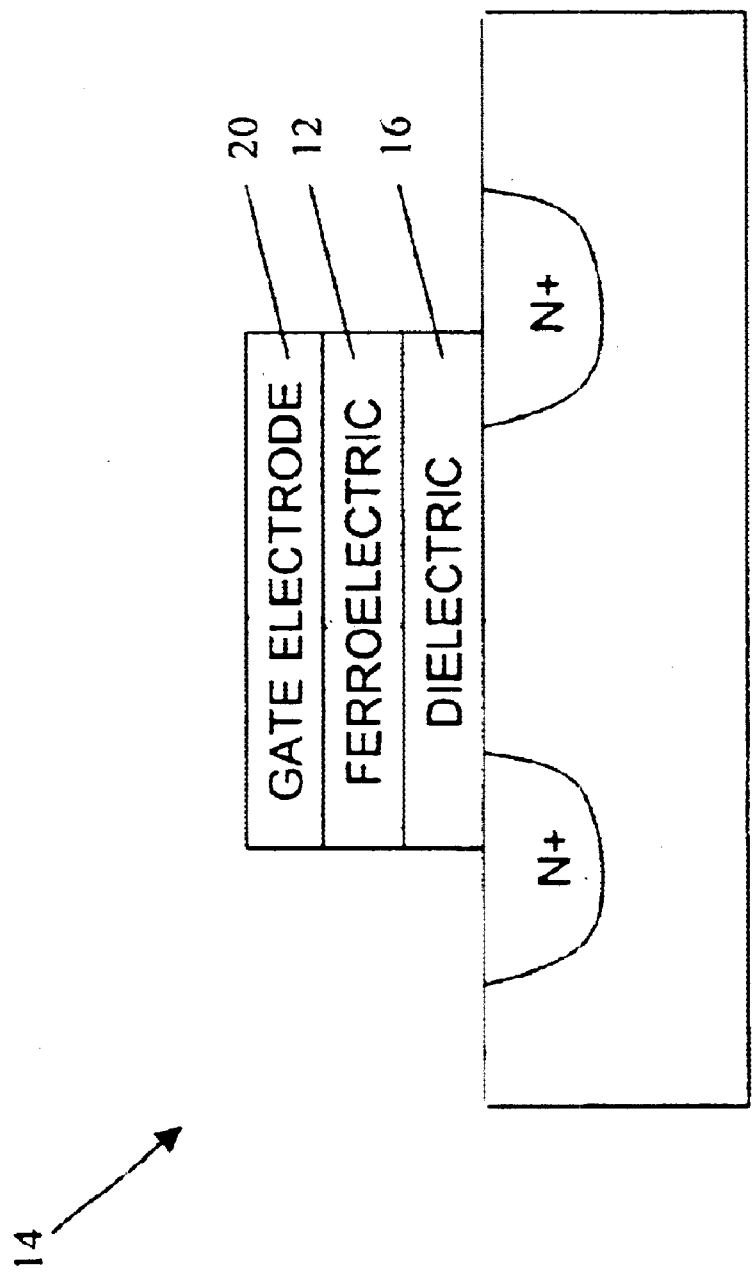
FIG. 2 is a cross section of a ferroelectric transistor with a bottom buffer layer as is known in the prior art.
Figure 3:
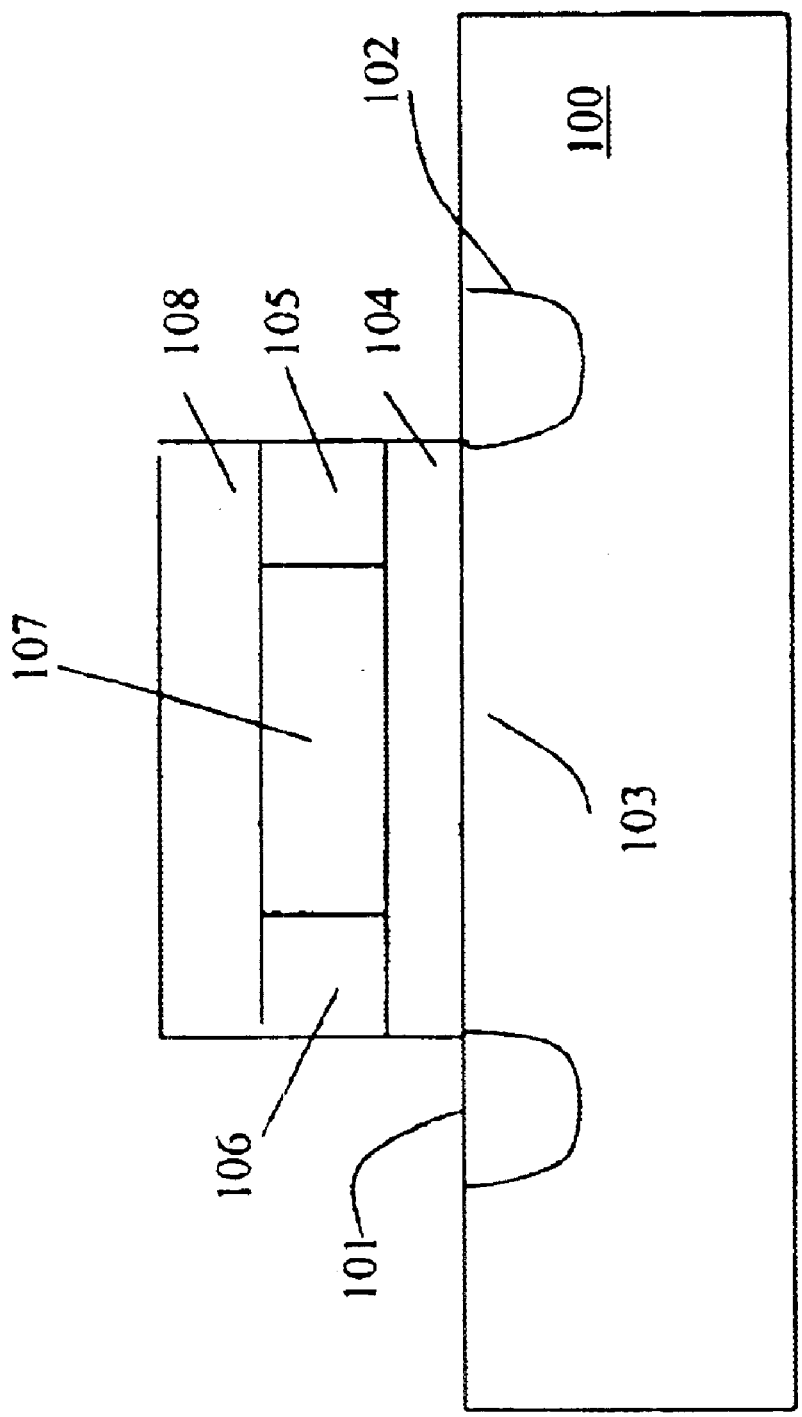
FIG. 3 is a cross sectional view illustrating the structure of a ferroelectric FET according to one embodiment of the present invention.

The present invention discloses a ferroelectric transistor structure exhibiting hysteresis wherein two storage bits are stored in a single device. FIG. 3 is a cross sectional view illustrating the structure of a ferroelectric FET according to one embodiment of the present invention. In a first embodiment, n-type silicon regions 101 and 102 are formed within p-type silicon substrate 100, the region between them disposing the channel region 103. A dielectric buffer layer 104 is formed on the channel region 103. Ferroelectric regions 105 and 106 are formed on dielectric buffer layer 104 in the vicinity of source 101 and drain 102, and a non-ferroelectric gate oxide layer 107 is formed between these ferroelectric regions 105 and 106. A gate electrode layer 108 is formed on top of dielectric layer 107 and ferroelectric regions 105 and 106. In operation, ferroelectric region 105 stores one bit and ferroelectric region 106 stores another bit.

Ferroelectric regions 105 and 106 can be formed using a sidewall processing technique. The non-ferroelectric gate dielectric 107 is deposited on the buffer layer 104 and patterned, followed by a deposition of a ferroelectric layer. The ferroelectric layer is then planarized using techniques such as chemical mechanical polishing (CMP), thereby removing the ferroelectric material from the top of non-ferroelectric dielectric gate oxide layer 107 but leaving the ferroelectric material on the sides of dielectric gate oxide 107 layer, forming ferroelectric regions 105 and 106 on the sides of dielectric gate oxide layer 107. The ferroelectric material utilized can be any material exhibiting hysteresis, including ferroelectrics with low dielectric constants and materials having the general formula $A_xMn_yO_z$ where x, y, z vary from 0.1 to 10 and A is a rare earth selected from a group consisting of Ce, Pr, Nd, Pm, Sm, Eu, GD, Tb, Dy, Ho, Er, Tm, Yb, Lu, Y or Sc. Ferroelectric materials with low dielectric constants increase the component of voltage across the ferroelectric layer when a voltage is applied across a structure consisting of buffer dielectric layers and ferroelectric layers. Such materials can be produced by any of a variety of methods including sputtering, spin-on gels, and MOCVD (metal-oxide-chemical-vapor-deposition).

Materials used as the dielectric layer include silicon nitride, silicon dioxide, thermally grown silicon dioxide, and dielectric materials with high dielectric constants. Buffer dielectric materials with high dielectric constants increase the component of voltage across the ferroelectric layer when a voltage is applied across a structure consisting of buffer dielectric layers and ferroelectric layers. More than one material can be layered to form the dielectric layer such as a silicon nitride layer overlying a silicon dioxide layer. Such materials can be formed by any of a variety of methods including ALD (atomic layer deposition), sputtering, and MOCVD.

Materials used as the electrode layer include metals, doped polysilicon, and metal silicides.

Figure 4:
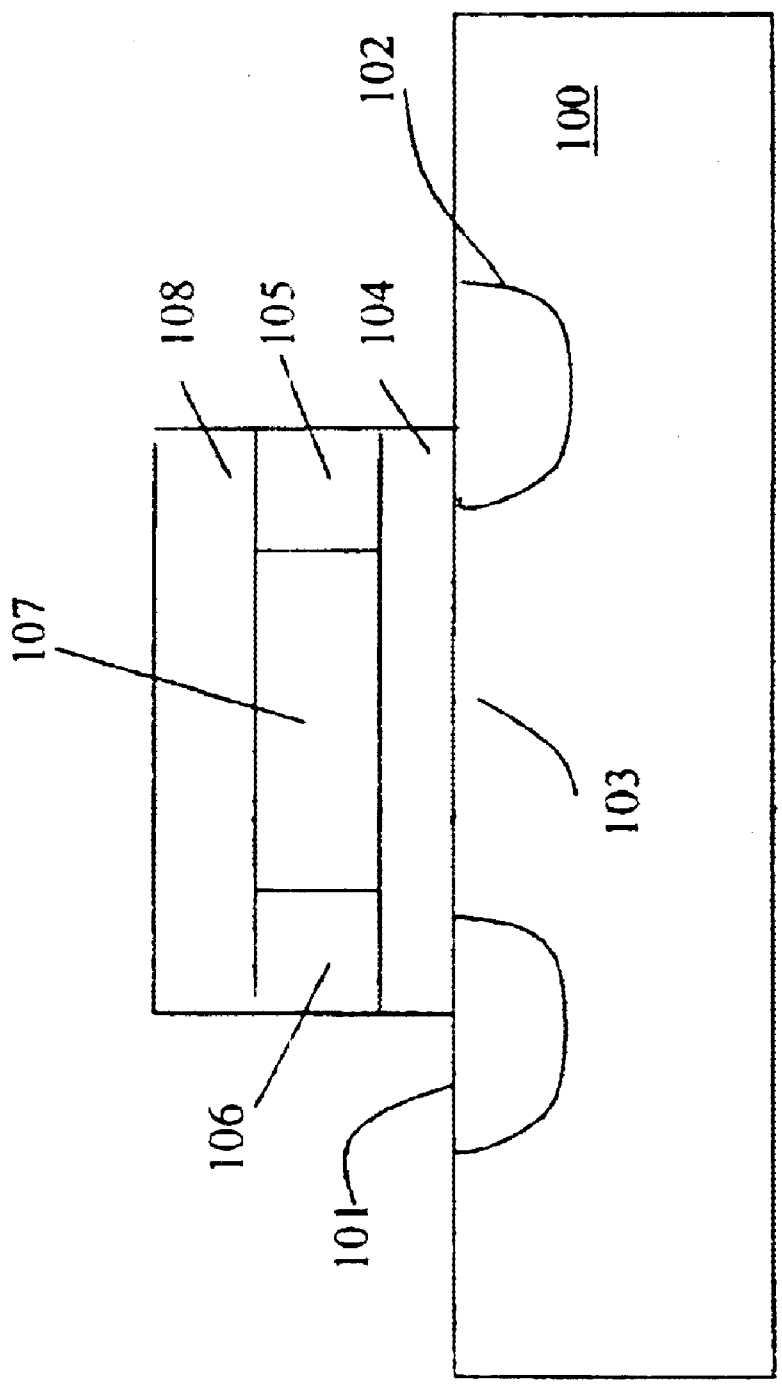
FIG. 4 illustrates the structure of a ferroelectric FET according to a second embodiment of the present invention wherein the n-type source and drain regions partially or fully overlap the ferroelectric regions.

FIG. 4 illustrates a second embodiment wherein the n-type region of source 101 and 102 partially or fully overlaps ferroelectric regions 106 and 105, respectively.

The substrate is a CMOS compatible silicon substrate or a silicon-on-insulator substrate or the like.

Figure 5:
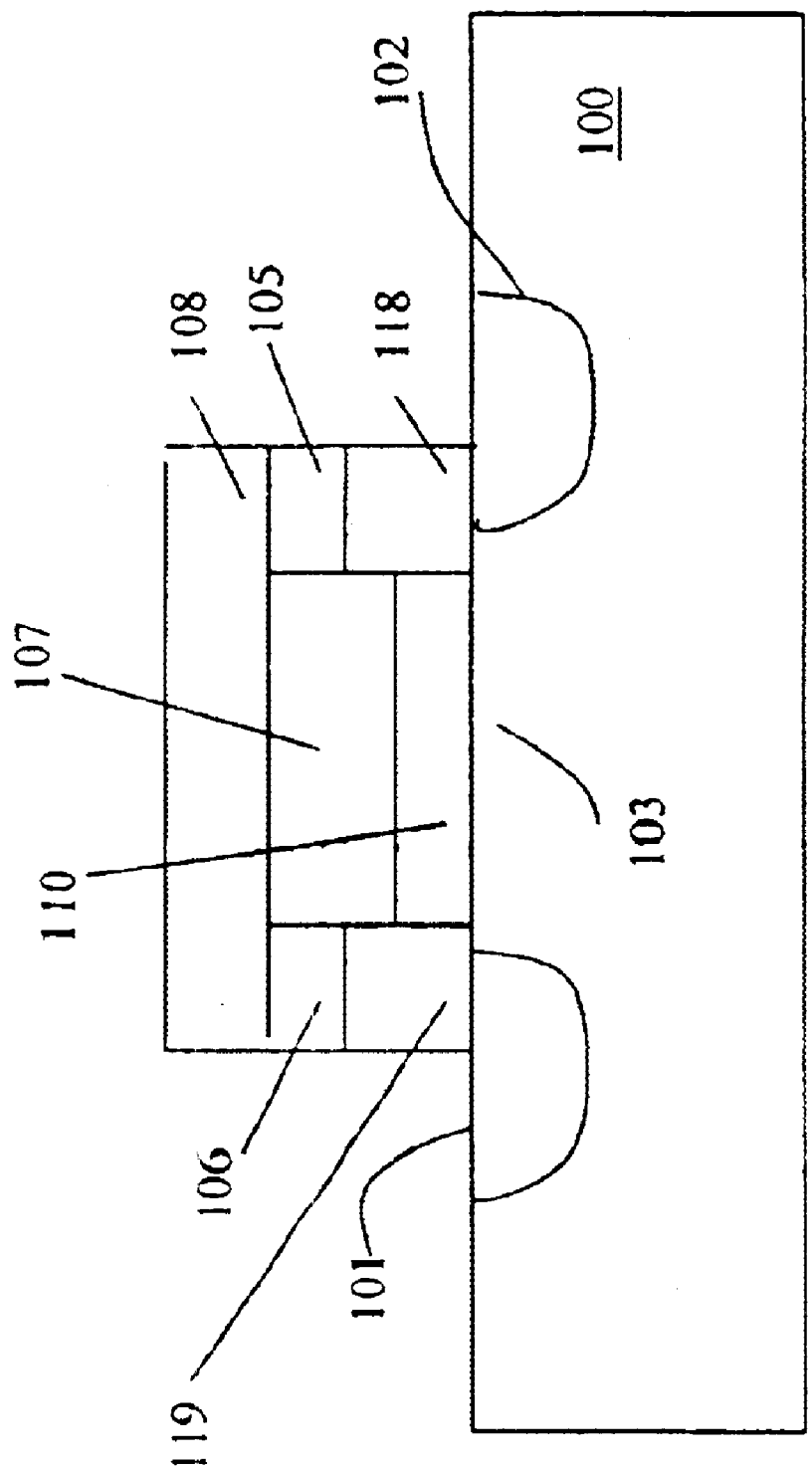
FIG. 5 illustrates a third embodiment wherein the buffer layers below the ferroelectric regions are made of different materials and have a different thickness than the dielectric between the ferroelectric regions.

FIG. 5 illustrates a third embodiment wherein buffer layer 118 and 119 under ferroelectric regions 105 and 106, respectively, are formed with a different material and a different thickness from buffer layer 110 under non-ferroelectric gate oxide 107.

Figure 6:
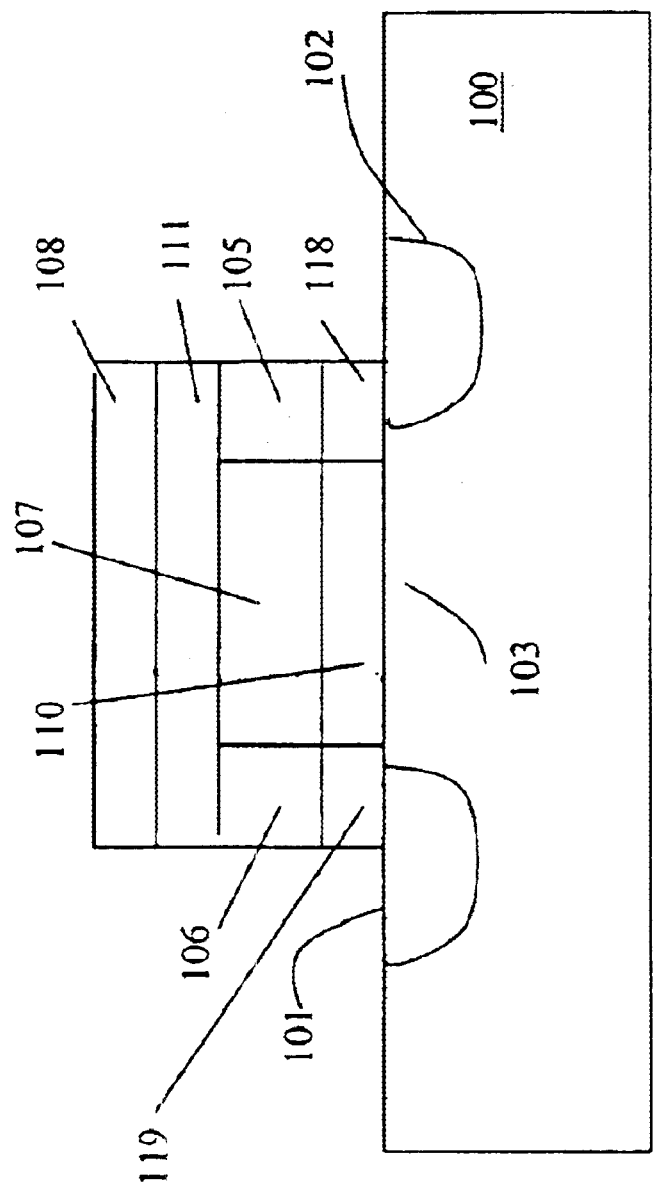
FIG. 6 illustrates a fourth embodiment wherein the top buffer layer is formed between the gate electrode and the top dielectric layer.

FIG. 6 illustrates a fourth embodiment wherein top buffer layer 111 is formed between the gate electrode 108 and the layer consisting of ferroelectric region 105, gate oxide layer 107, and ferroelectric region 106. In this embodiment, this top buffer layer serves to reduce high electric fields at the gate electrode/ferroelectric interface, to contain the ferroelectric materials within an encapsulated region, to reduce leakage currents, and to keep hydrogen away from the ferroelectric materials.

Figure 7:
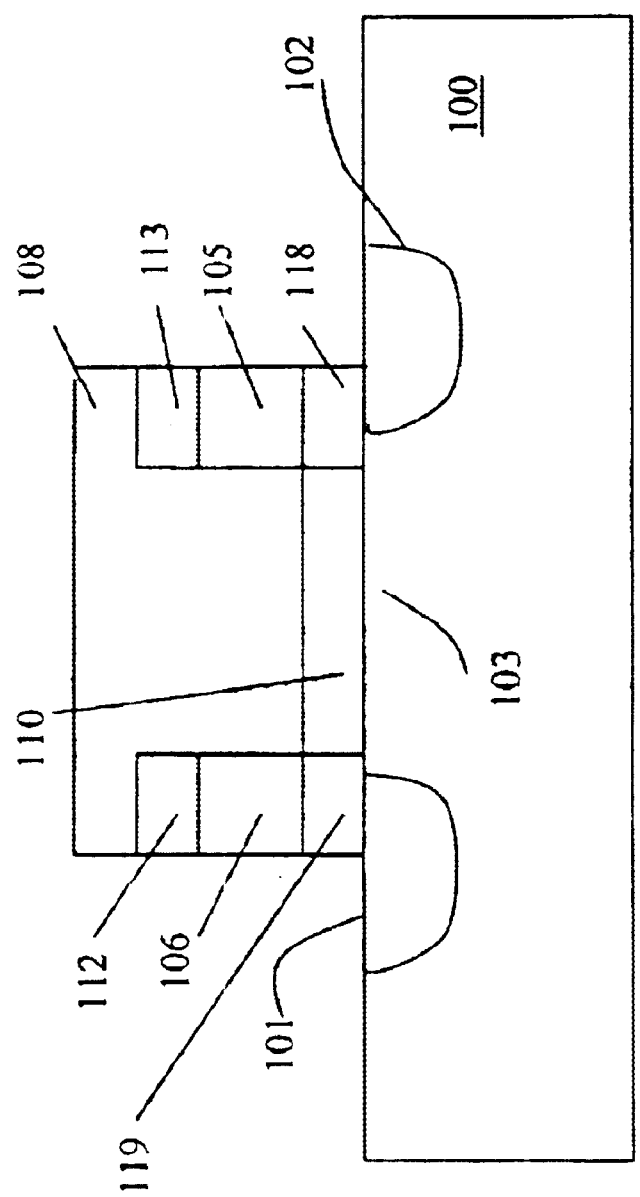
FIG. 7 illustrates a fifth embodiment wherein the top buffer layers are formed over the ferroelectric regions.

FIG. 7 illustrates a fifth embodiment wherein top buffer layers 113 and 112 are formed over ferroelectric regions 105 and 106, respectively. In this embodiment, no buffer layer is formed between gate electrode layer 108 and the bottom oxide layer 110.

Figure 8:
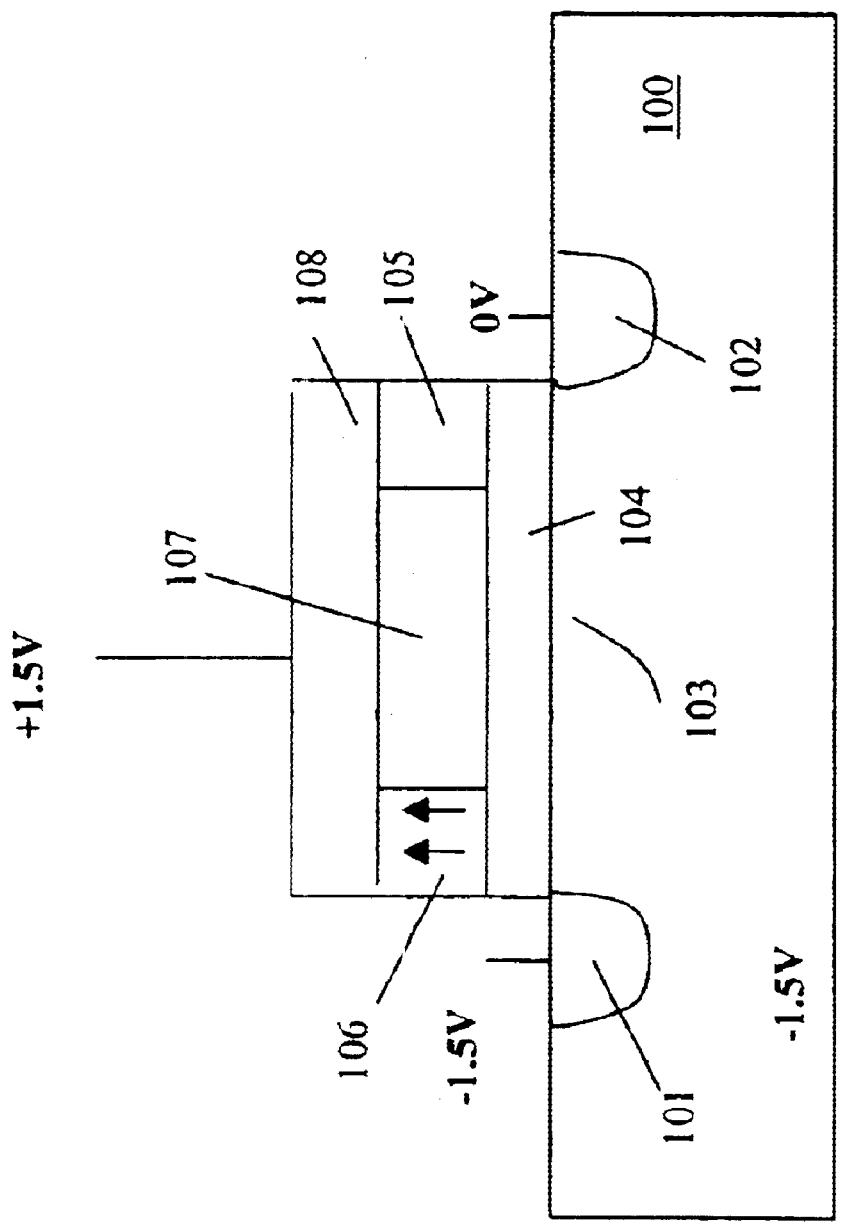
FIG. 8 illustrates an example of the applied voltages to the ferroelectric transistor structure in order to polarize a left ferroelectric region to one state.

FIG. 8 illustrates an example of the voltages applied to the ferroelectric transistor structure in order to polarize left ferroelectric region 106 to one state, herein referred to as the "low state". A voltage of +1.5V is applied to the gate electrode, −1.5V is applied to n-type region 101, 0V is applied to n-type region 102, and −1.5V is applied to substrate 100, thereby avoiding a forward bias condition between n-type region 101 and substrate 100. The applied voltage between n-type region 101 and electrode 108 determines the electric field strength on ferroelectric region 106, while the applied voltage between n-type region 102 and electrode 108 determines the field strength on ferroelectric region 105. For the purposes of illustration, the coercive voltage is assumed to be 2V. Accordingly, the polarization of ferroelectric region 105 remains unchanged since the applied voltage between n-type region 102 and electrode 108 is 1.5V, less than the coercive voltage. The voltage between n-type region 101 and electrode 108 is 3V, greater than the coercive voltage. It is assumed for the purposes of illustration that voltage drops across bottom buffer layer 104 and the top buffer layer, if there is one, are sufficiently small due to appropriate dielectric constants and thicknesses in order to produce at least a coercive voltage across ferroelectric region 106. Accordingly, ferroelectric region 106 polarizes to a low state.

When the applied voltages are removed, the ferroelectric polarization remains. Since ferroelectric region 106 is in the vicinity of n-type region 101, the electric field affects the turn-on threshold voltage when n-type region 101 is operated as the source of the transistor. The direction of the electric field produced when ferroelectric region 106 is polarized to the "low state" causes the turn-on threshold to be lower than if that same region were not polarized. For the purposes of illustration, the threshold voltage corresponding to the low state is 0.5V.

Figure 9:
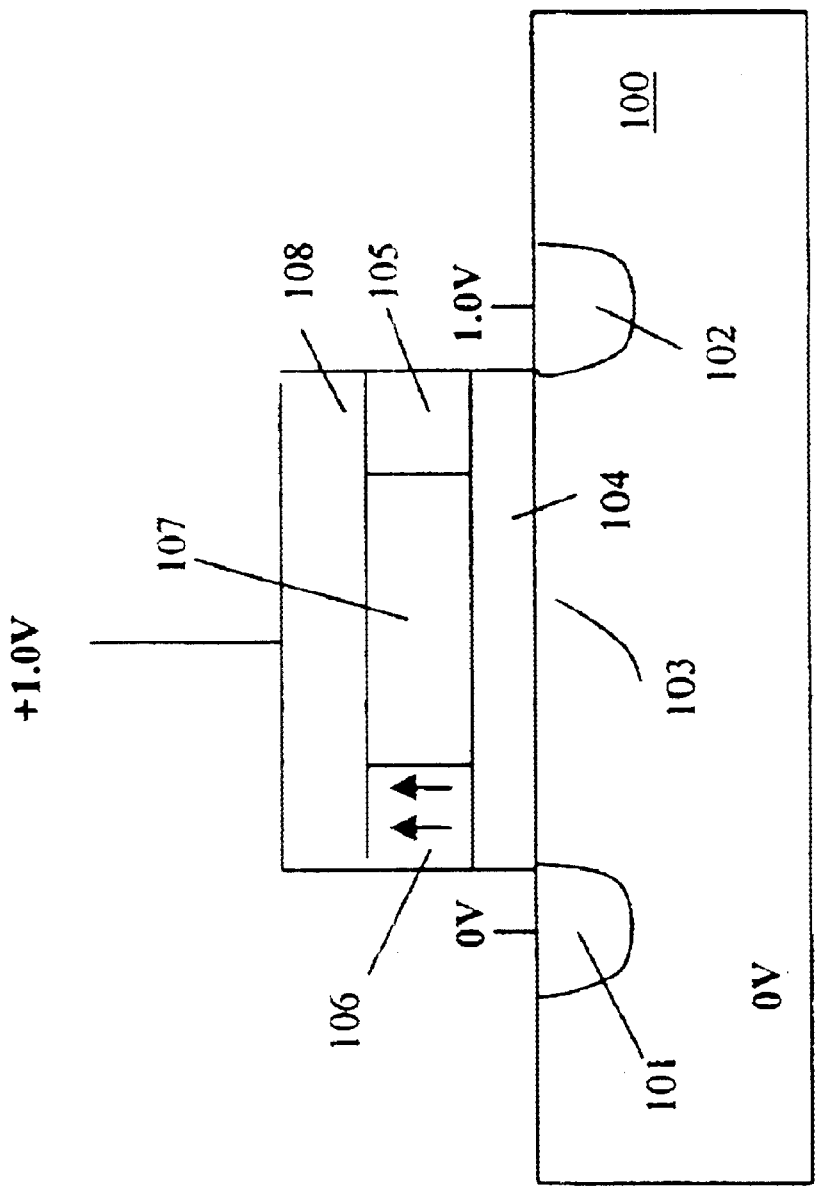
FIG. 9 illustrates an example of a read bias of the ferroelectric FET wherein one n-type region acts as a source.

FIG. 9 illustrates an example of a read bias of the ferroelectric FET wherein n-type region 101 acts as a source. A voltage of 1.0V is applied to gate electrode 108, 0V to n-type region 101 thereby acting as the source, 1.0V to n-type region 102 thereby acting as a drain, and 0V to substrate 100. Assuming that ferroelectric region 106 is polarized to the low state, the turn-on threshold of the FET is 0.5V. The polarization of the ferroelectric material in region 105 does not affect the threshold voltage since the channel is pinched off in this region, and carriers are injected from the point of pinch-off to the depletion region around the drain. Therefore a current flows from source 101 to drain 102 in this device.

Figure 10:
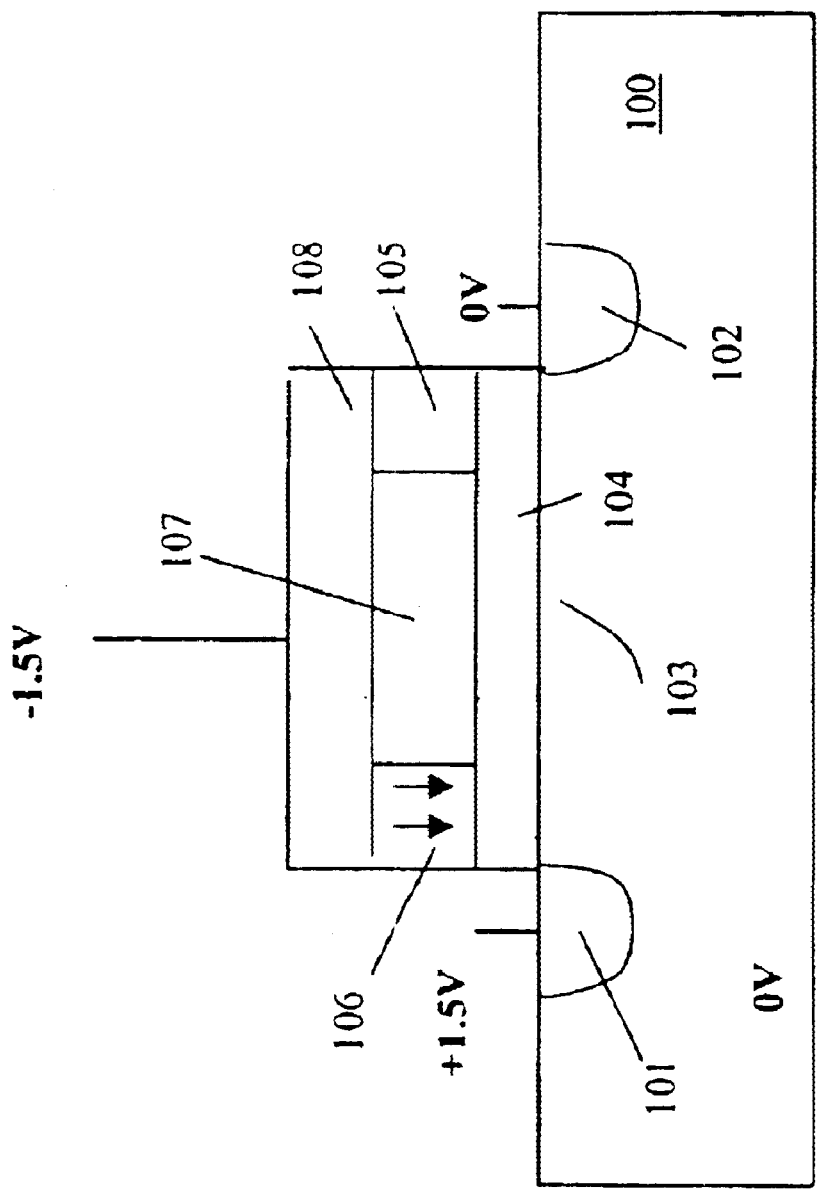
FIG. 10 illustrates an example of a bias that polarizes the ferroelectric material in a left region to a "high state".

FIG. 10 illustrates an example of a bias that polarizes the ferroelectric material in region 106 to a "high state". A voltage of −1.5V is applied to the gate electrode, +1.5V is applied to n-type region 101, 0V is applied to n-type region 102, and 0V is applied to substrate 100. The applied voltage between n-type region 101 and electrode 108 is higher than the coercive voltage, and the electric field is in the direction to polarize the ferroelectric material to a "high state". For purposes of illustration, the threshold voltage corresponding to the high state is 1.5V.

Figure 11:
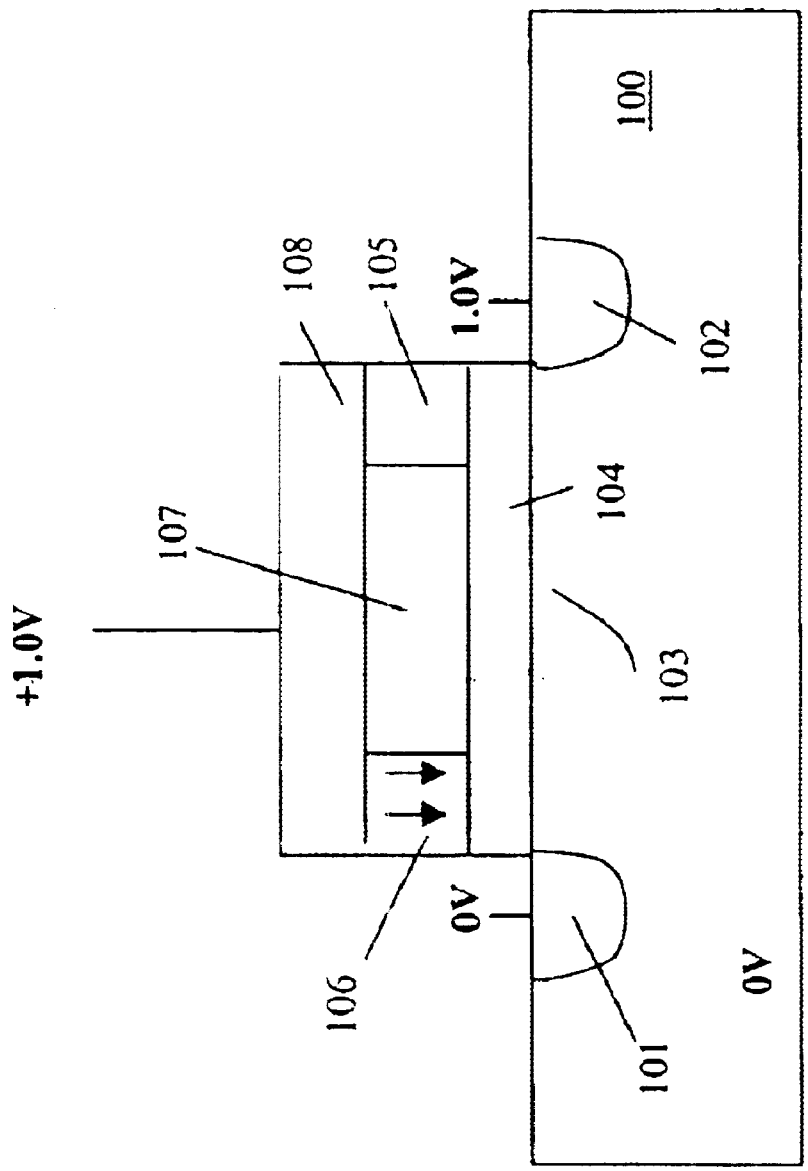
FIG. 11 illustrates an example of a read bias of the ferroelectric FET wherein an n-type region acts as a source when the ferroelectric material of region is polarized in the high state.

FIG. 11 illustrates an example of a read bias of the ferroelectric FET wherein n-type region 101 acts as a source when the ferroelectric material of region 106 is polarized in the high state. A voltage of 1.0V is applied to gate electrode 108, 0V to n-type region 101 thereby acting as the source, 1.0V to n-type region 102 thereby acting as a drain, and 0V to substrate 100. For the sake of illustration, it is assumed that when the ferroelectric region 106 is polarized to the high state, the turn-on threshold of the FET is 1.5V. The polarization of the ferroelectric material in region 105 does not affect the threshold voltage since the channel in this region is depleted. Since the turn-on threshold voltage is higher than the gate-to-source voltage, no current flows through this device.

Figure 12:
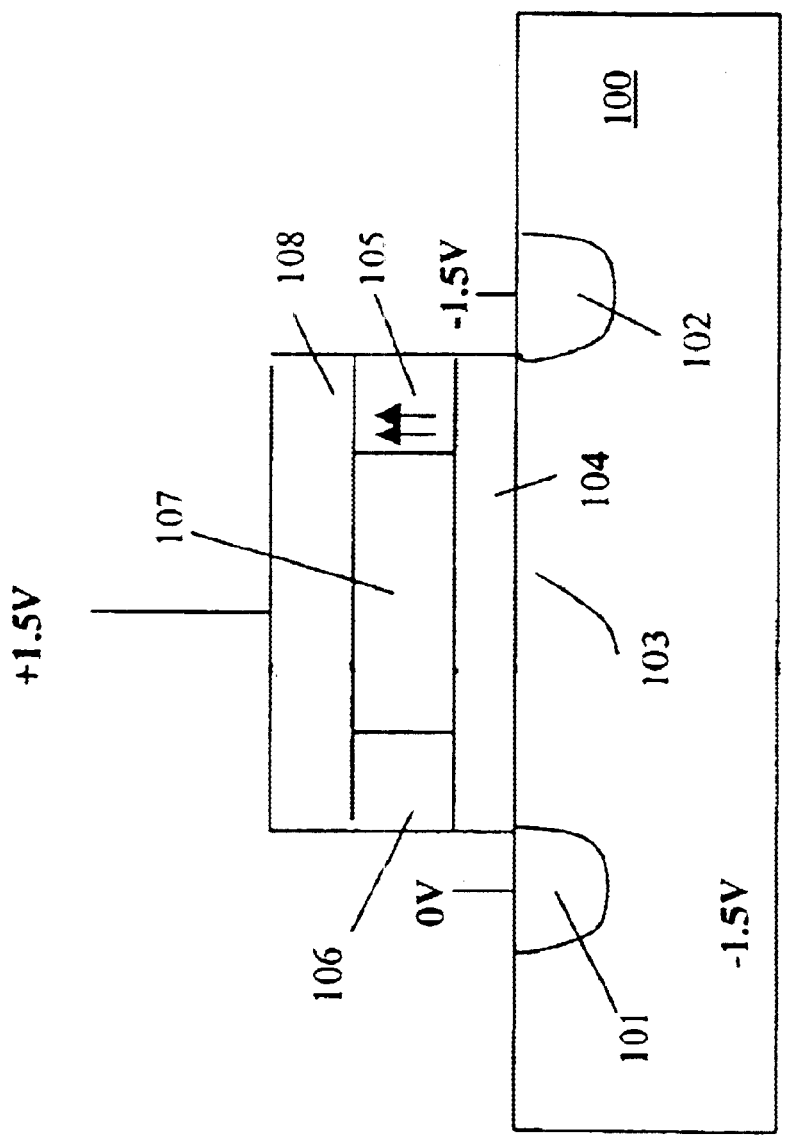
FIG. 12 illustrates an example of the applied voltages to the ferroelectric transistor structure in order to polarize right ferroelectric region to a "low state".

FIG. 12 illustrates an example of the voltages applied to the ferroelectric transistor structure in order to polarize right ferroelectric region 105 to the "low state". A voltage of +1.5V is applied to the gate electrode, 0V is applied to n-type region 101, −1.5V is applied to n-type region 102, and −1.5V is applied to substrate 100, thereby avoiding a forward bias condition between n-type region 102 and substrate 100. The applied voltage between n-type region 102 and electrode 108 is greater than the coercive voltage, while the voltage between n-type region 101 and gate electrode 108 is less than the coercive voltage. Accordingly, the polarization of ferroelectric region 106 remains unchanged since the applied voltage between n-type region 101 and electrode 108 is 1.5V, less than the coercive voltage. The voltage between n-type region 102 and electrode 108 is 3V, greater than the coercive voltage. It is assumed for the purposes of illustration that voltage drops across bottom buffer layer 104 and the top buffer layer 108, if there is one, are sufficiently small to allow at least a coercive voltage across ferroelectric region 105. Accordingly, ferroelectric region 105 is polarized to the low state.

Figure 13:
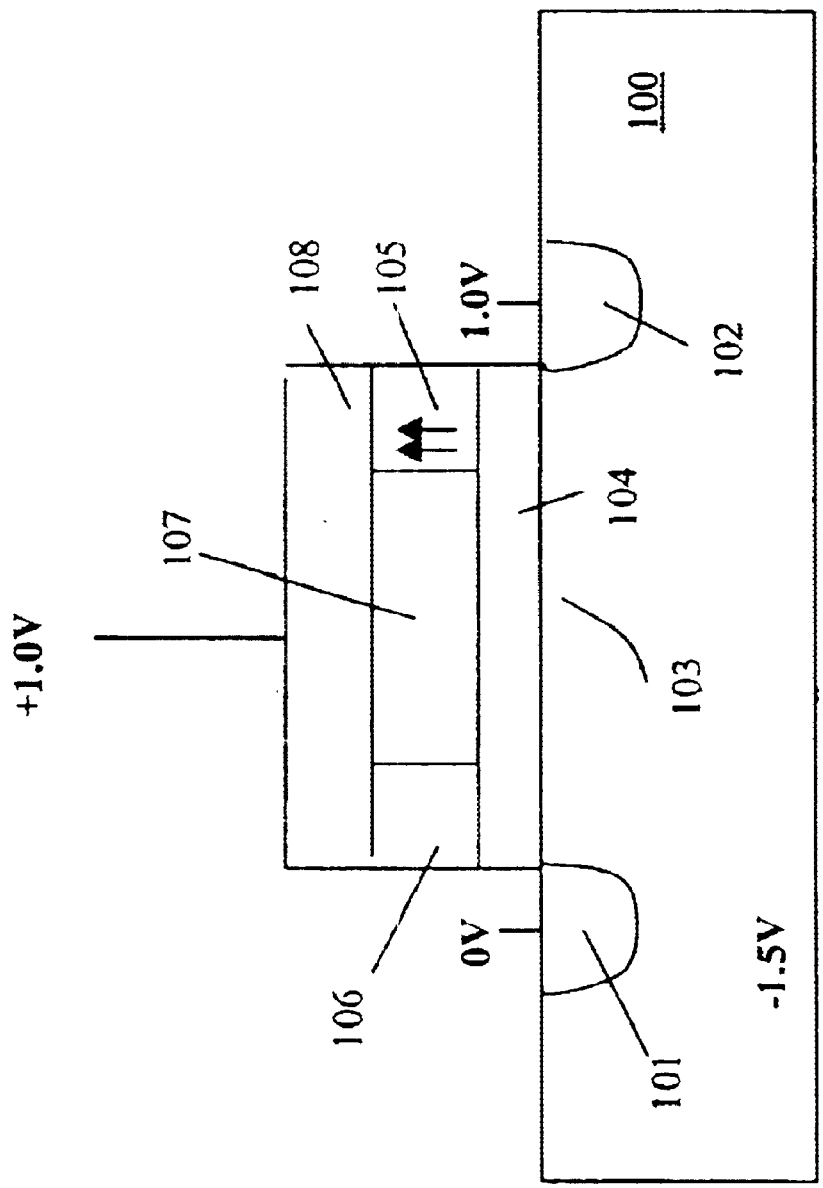
FIG. 13 illustrates an example of a read bias of the ferroelectric FET wherein an n-type region acts as a source.

FIG. 13 illustrates an example of a read bias of the ferroelectric FET wherein n-type region 102 acts as a source. A voltage of 1.0V is applied to gate electrode 108, 0V to n-type region 102 thereby acting as the source, 1.0V to n-type region 101 thereby acting as a drain, and 0V to substrate 100. Assuming that ferroelectric region 105 is polarized to the low state, the turn-on threshold of the FET is 0.5V. The polarization of the ferroelectric material in region 106 does not affect the threshold voltage since the channel in this region is depleted. Therefore a current flows from source 102 to drain 101 in this device.

Figure 14:
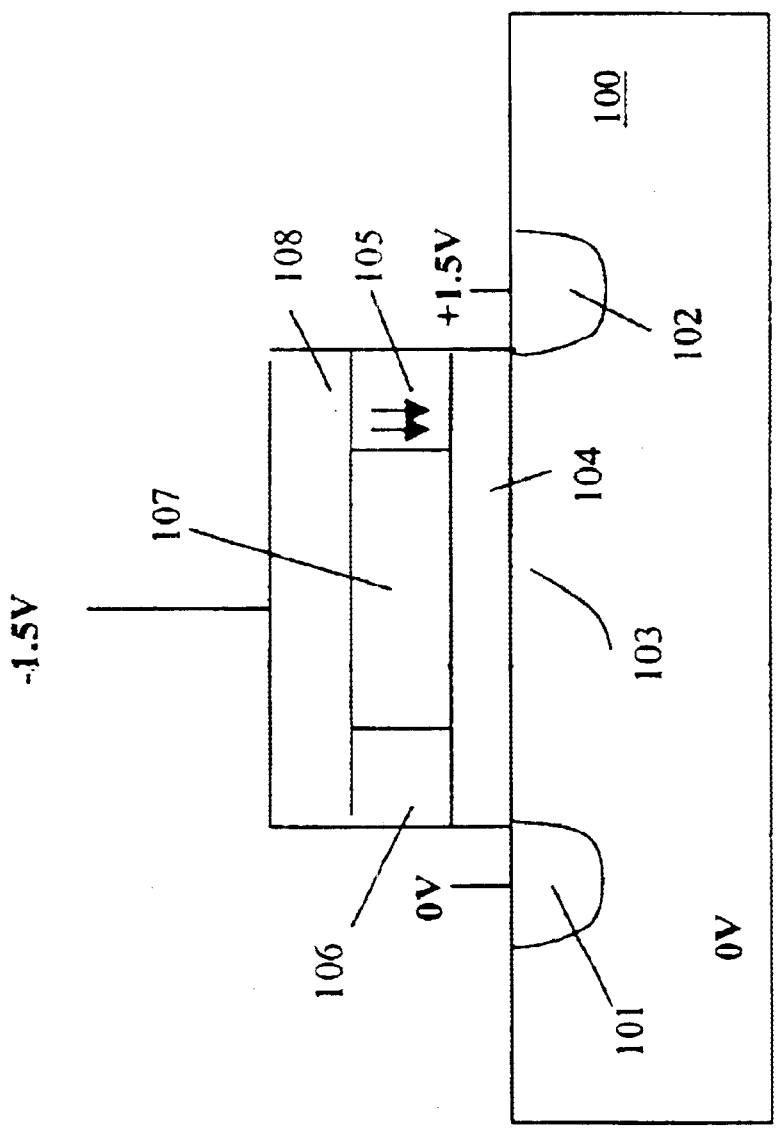
FIG. 14 illustrates an example of a bias that polarizes the ferroelectric material in a right region to a "high state".

FIG. 14 illustrates an example of a bias that polarizes the ferroelectric material in region 105 to a high state. A voltage of −1.5V is applied to the gate electrode, 0V is applied to n-type region 101, +1.5V is applied to n-type region 102, and 0V is applied to substrate 100. The applied voltage between n-type region 102 and electrode 108 is higher than the coercive voltage; the electric field is the direction to polarize the ferroelectric material to a high state, corresponding to a turn-on threshold of 1.5V.

Figure 15:
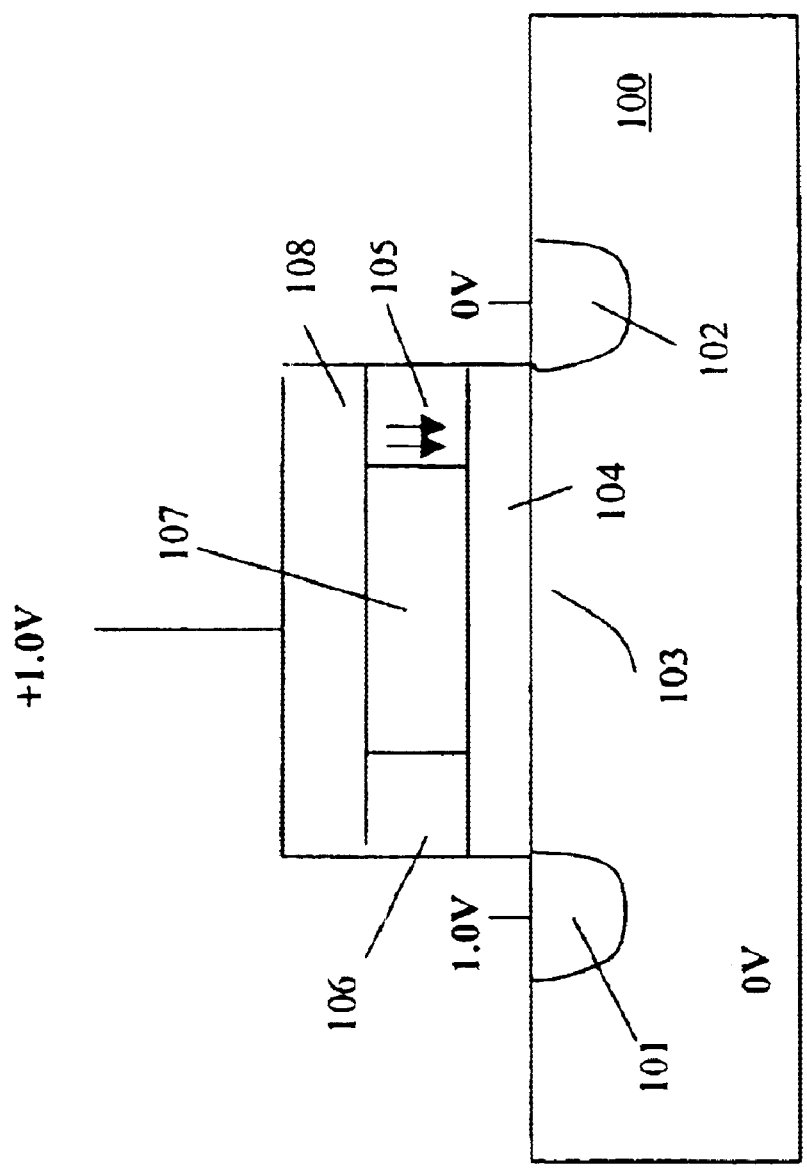
FIG. 15 illustrates an example of a read bias of the ferroelectric FET wherein an n-type region acts as a source.

FIG. 15 illustrates an example of a read bias of the ferroelectric FET wherein n-type region 102 acts as a source and the ferroelectric region 105 is polarized to the high state. A voltage of 1.0V is applied to gate electrode 108, 0V to n-type region 102 thereby acting as the source, 1.0V to n-type region 101 thereby acting as a drain, and 0V to substrate 100. Assuming that ferroelectric region 105 is polarized to the high state, the turn-on threshold of the FET is 1.5V. The polarization of the ferroelectric material in region 106 does not affect the threshold voltage since the channel in this region is depleted. Therefore, no current flows between source 102 to drain 101 in this device.

Optionally, the voltages used to polarize the ferroelectric regions 105 and 106 can be made significantly larger in magnitude than the voltages used to read the data state. For example, the voltages used to polarize the ferroelectric material might be 5V, while the peak read voltages used are 1V. Successive voltages applied to the device during the read, though less than the coercive voltage, nevertheless may alter the polarization of some ferroelectric materials. By using voltages for read that are low relative to the polarization voltage, potential disturbs to the polarization state that might result are minimized.

Figure 16:
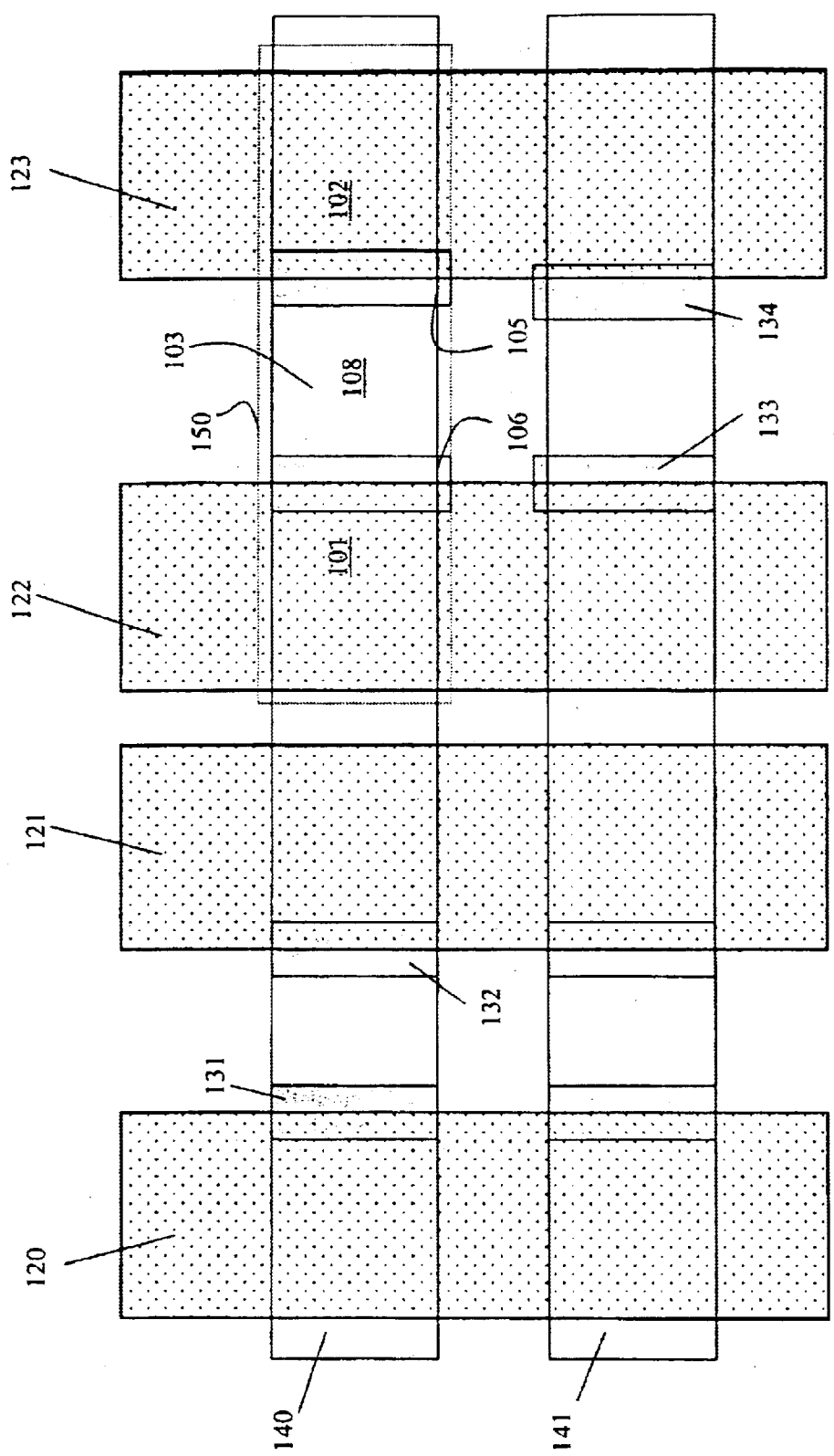
FIG. 16 is a plan view diagram illustrating the ferroelectric FET structures placed and electrically connected in rows and columns to form a memory array.

FIG. 16 is a plan view diagram illustrating the ferroelectric FET structures placed and electrically connected in rows and columns to form a memory array. Gate electrodes of FETs in any given row of the array are connected with a word line. In one embodiment, the word line consists of a strip of conductive thin film 140 or 141 across the array, consisting of any conductive material including platinum, aluminum, polysilicon, and silicides. The source and drains of FETs in any given column of the array are electrically connected. In one embodiment, sources of FETs in a given column are connected with strips of n-type material formed in a p-type substrate, such as diffused bit line 122 of FIG. 16. Drains are similarly connected with diffused bit line 123. The ferroelectric material is formed on the inside edges of the word line where the bit line intersects the word line. For example, ferroelectric material 133 and 134 are formed along the inside edge of bit line 122 and 123, respectively. This ferroelectric material may overlap, partially overlap, or underlap the diffused bit line.

The region 150 of FIG. 16 is a single cell within the memory array, each terminal marked with the same numbers as used in the cross sectional diagram of FIG. 15. Bit line 122 and bit line 123 under word line 140 form n-type region source/drain 101 and source/drain 102, respectively. The region between source/drain 101 and 102 disposes the channel region 103. Above channel 103 is the gate electrode 108. Ferroelectric regions 105 and 106 in the memory cell are formed where bit line 122 and 123 intersect word line 140, respectively.

Figure 17:
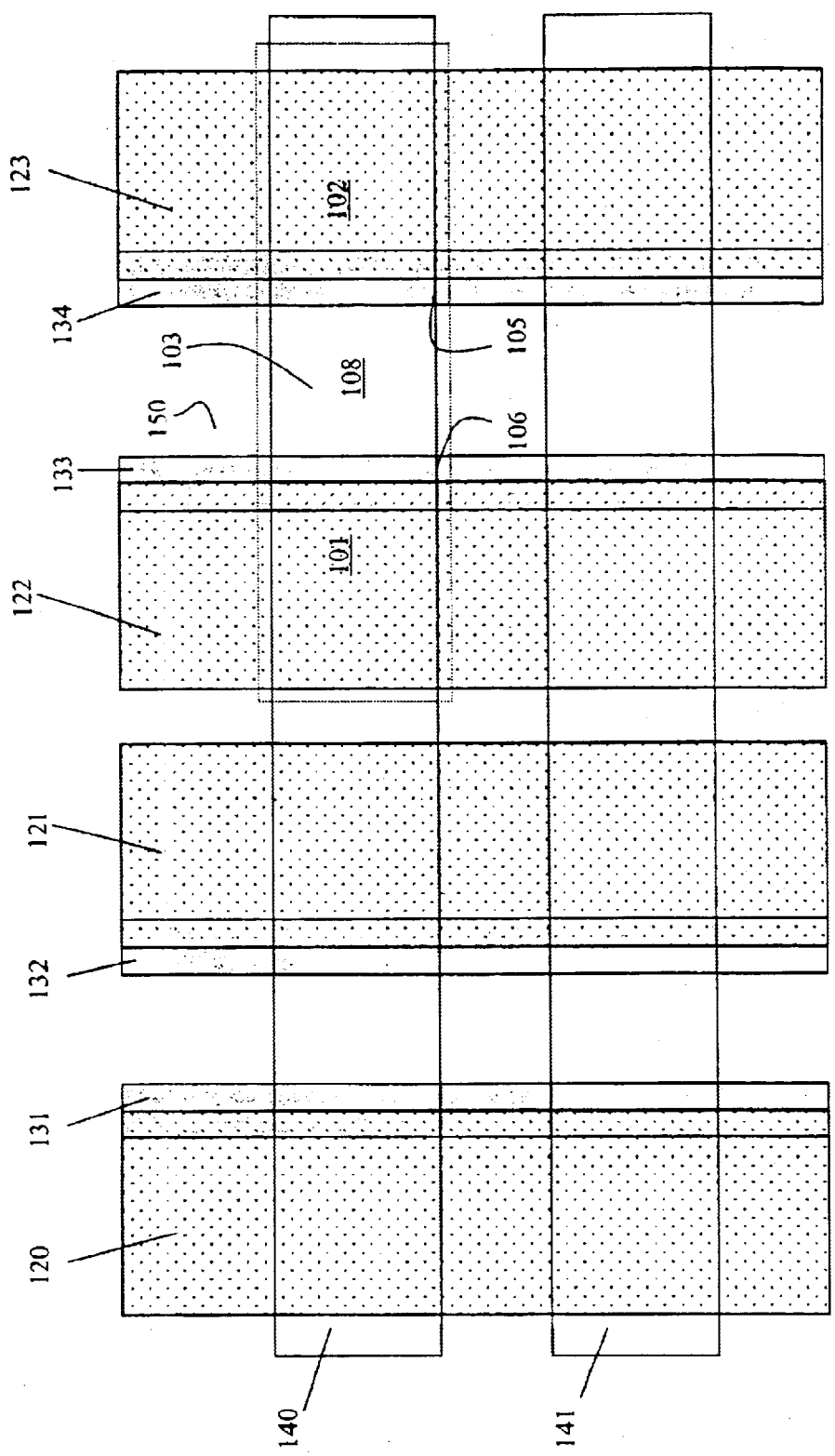
FIG. 17 illustrates another embodiment wherein the ferroelectric material is removed between the word lines.

FIG. 17 illustrates another embodiment wherein the ferroelectric material is not removed between the word lines. The ferroelectric material without an overlying word line is electrically inactive since the ferroelectric material in those areas has no top electrode.

Figure 18:
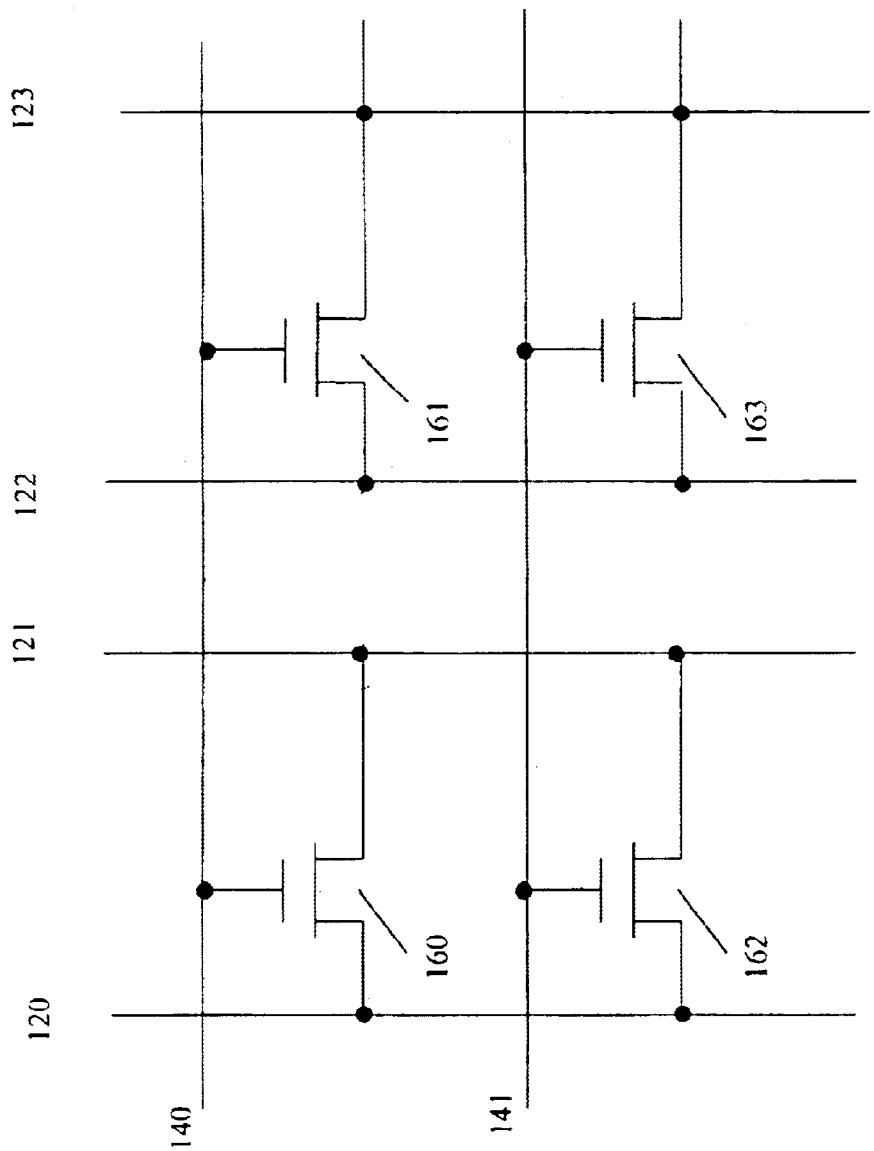
FIG. 18 is a schematic diagram illustrating the connection of ferroelectric FETs connected in rows and columns to form a memory array.

FIG. 18 is a schematic diagram illustrating the connection of ferroelectric FETs connected in rows and columns to form a memory array. The diagram shows word line 140 connecting the gates of FETs 160 and 161, and word line 141 connecting the gates of FETs 162 and 163. Columns 120 and 121 connects the sources and drains of FETs 160 and 162. Columns 122 and 123 connect the sources and drains of FETs 161 and 163.

Figure 19:
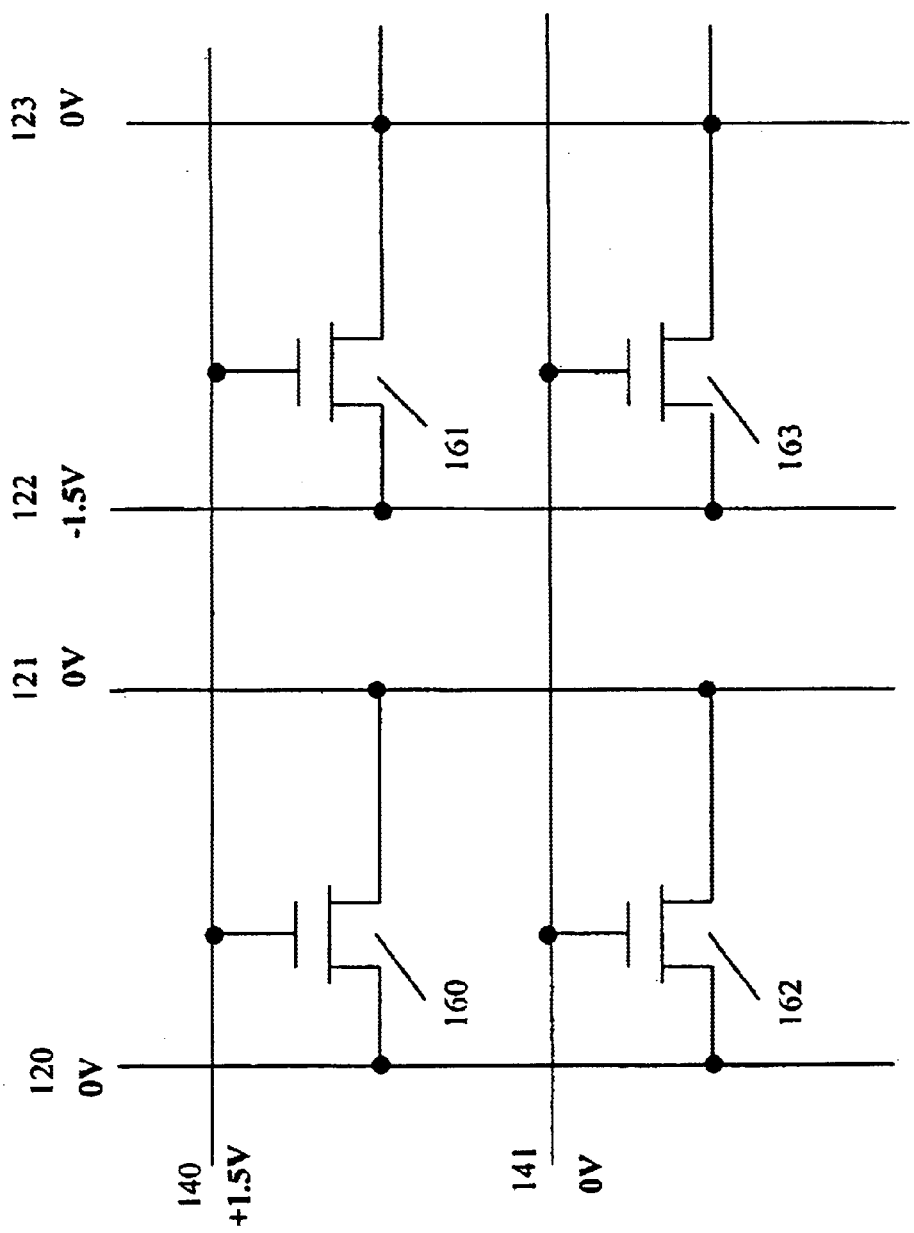
FIG. 19 is a schematic diagram indicating a bias on the columns and rows to polarize the left ferroelectric region of an FET to a low state according to the present invention.

FIG. 19 is a schematic diagram indicating a bias on the columns and rows to polarize the left ferroelectric region of FET 161 to a low state. A voltage of −1.5V is applied to the selected bit line 122, and +1.5V on selected word line 140. A voltage of −1.5V is applied to the substrate to avoid the n-type regions forward biasing to the substrate. More than a coercive voltage is thereby applied across left ferroelectric region of FET 161, polarizing it to a low state. 0V is applied to unselected word lines and bit lines, thereby applying less than a coercive voltage to right ferroelectric region of FET 161, and so this polarization stays unchanged. This same bias is applied to the left and right ferroelectric regions of FETs along the selected word line on deselected bit lines, for example FET 160 of FIG. 19. FET 163 illustrates that less than a coercive voltage is also applied to an FET on a deselected word line but selected bit line. FET 162 is an example of an FET bias on a deselected word line and deselected bit lines. In this case, no electric field is applied across the ferroelectric regions of the device, thereby leaving the polarization unchanged.

Figure 20:
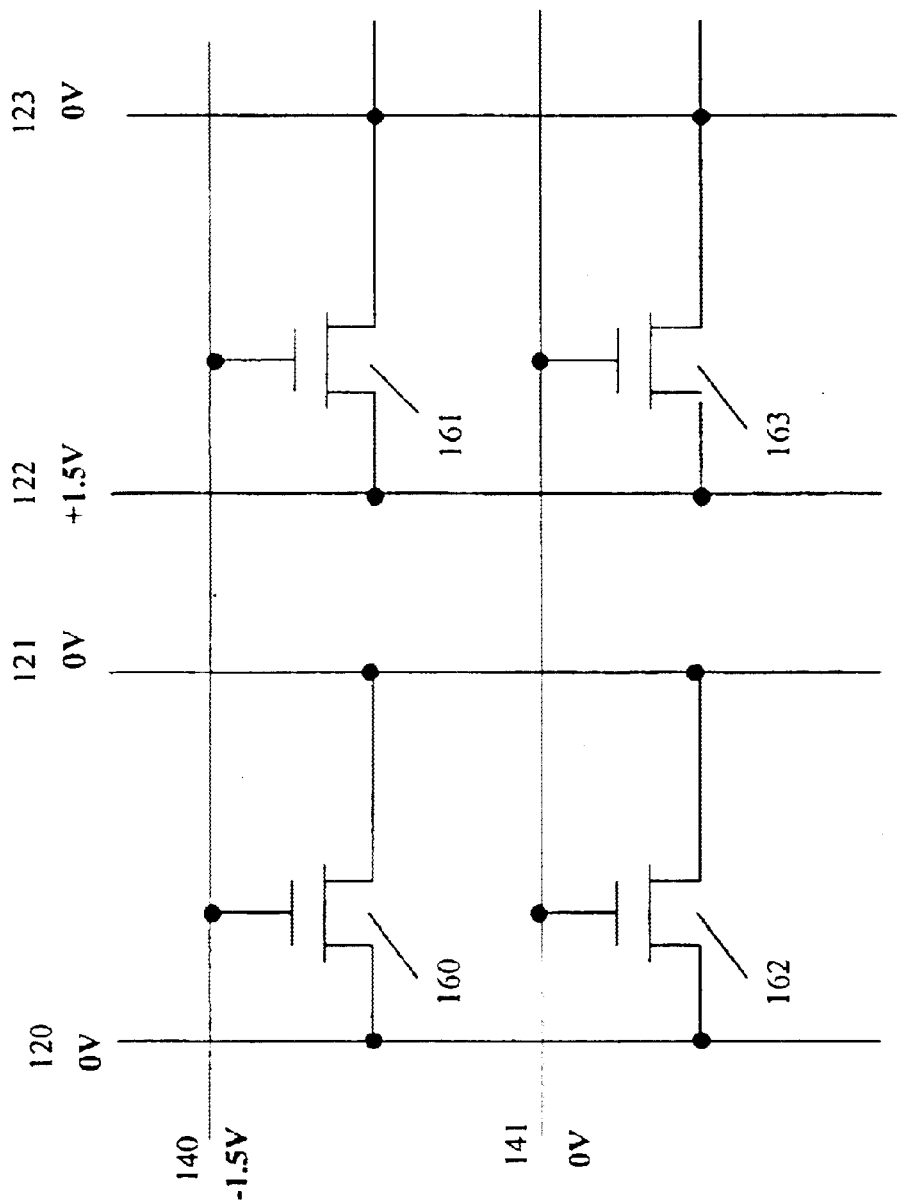
FIG. 20 is a schematic diagram indicating a bias on the columns and rows to polarize the left ferroelectric region of an FET to a high state according to the present invention.

FIG. 20 is a schematic diagram indicating a bias on the columns and rows to polarize the left ferroelectric region of FET 161 to a high state. A voltage of +1.5V is applied to the selected bit line 122, and −1.5V on selected word line 140. The substrate is biased to 0V. More than a coercive voltage is thereby applied across left ferroelectric region of FET 161, polarizing it to a high state. 0V is applied to unselected word lines and bit lines, thereby applying less than a coercive voltage to right ferroelectric region of FET 161, and so this polarization stays unchanged. This same bias is applied to the left and right ferroelectric regions of FETs along the selected word line on deselected bit lines, for example FET 160 of FIG. 20. FET 163 illustrates that less than a coercive voltage is also applied to an FET on a deselected word line but selected bit line. FET 162 is an example of an FET bias on a deselected word line and deselected bit lines. In this case, no electric field is applied across the ferroelectric regions of the device, thereby leaving the polarization unchanged.

Figure 21:
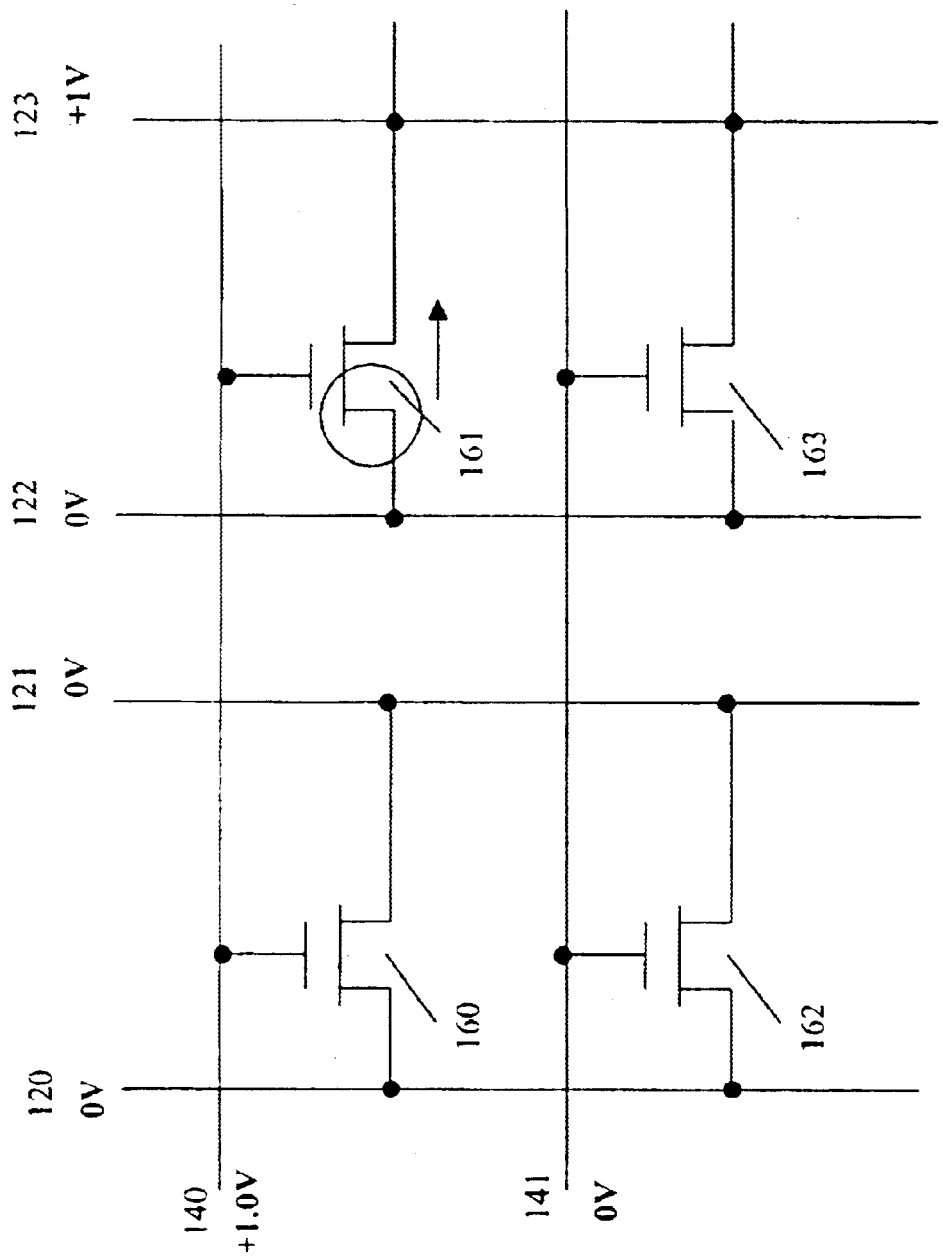
FIG. 21 is a schematic diagram indicating a bias on the columns and rows to read the polarized state of the left ferroelectric region of an FET according to the present invention.

FIG. 21 is a schematic diagram indicating a bias on the columns and rows to read the polarized state of left ferroelectric region of FET 161. A voltage of +1.0V is applied to selected word line 140. 0V is applied to the bit line connected to the left n-type region of FET 161, that n-type region thereby acting as the source. The gate-to-source voltage is therefore 1.0V. 1.0V is applied to the other n-type region of FET 161, thereby acting as the drain. If the high state is stored on the left ferroelectric, FET 161 remains off since the turn-on threshold of FET 161 would then be 1.5V, higher than the applied gate-to-source voltage. If a low state is stored in the left ferroelectric, FET 161 turns on since the turn-on threshold of the FET is 0.5V, less than the gate-to-source voltage.

No current flows through any other device in the array. The FETs along the selected word line, such as FET 160, have 0V on both the source and drain. The FETs along the unselected word line, such as FETs 162 and 163, have 0V on the gate.

Figure 22:
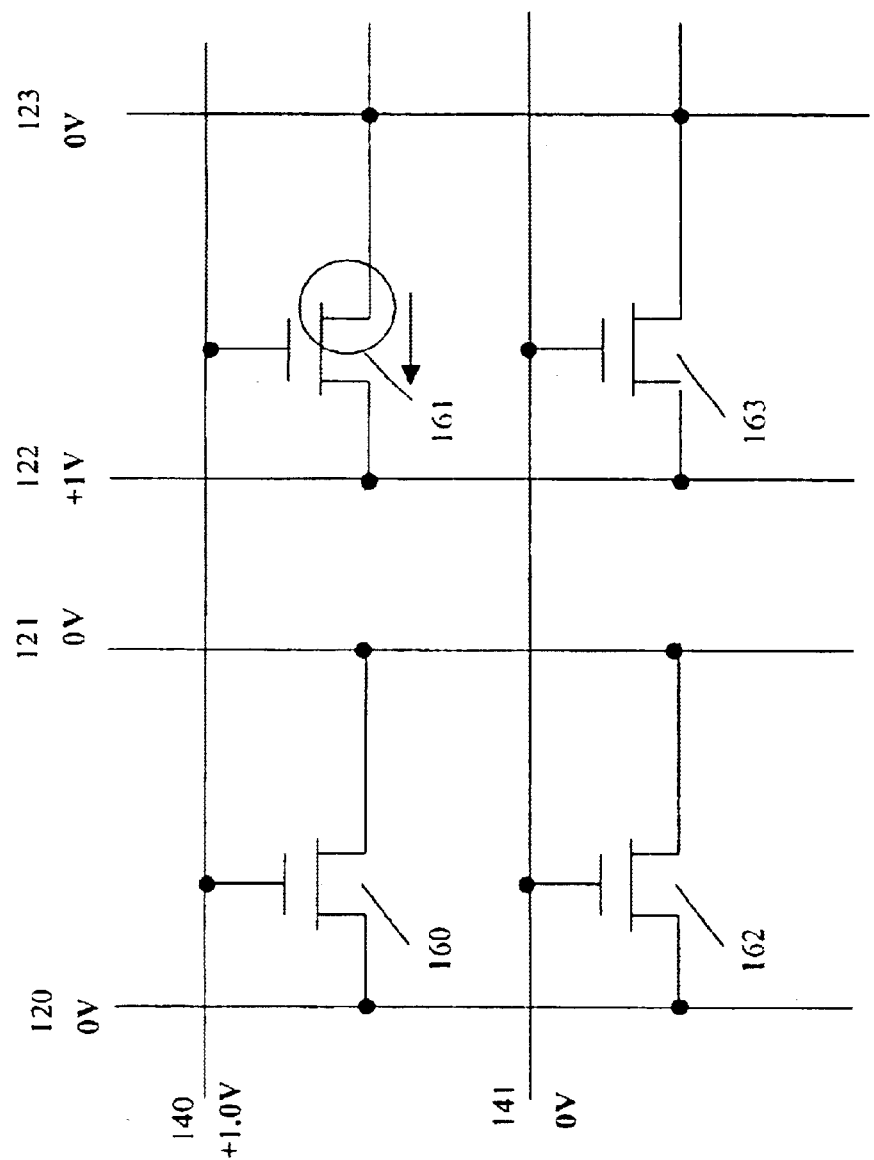
FIG. 22 illustrates the biasing in order to read the polarization of the right ferroelectric region of an FET according to the present invention.

FIG. 22 illustrates the biasing in order to read the polarization of the right ferroelectric region of FET 161. Biasing is identical to FIG. 21, except that the voltages on bit line 122 and 123 are reversed. Now the right n-type region acts as source of FET 161. Measuring the resulting current determines the polarization state, high current corresponding to a low state and low current corresponding to a high state.

The foregoing description is only illustrative of the invention. Various alternatives and modifications can be devised by those skilled in the art without departing from the invention. In particular, though reference to a ferroelectric FET formed on a P-type silicon substrate and N-type source and drain regions has been made, the ferroelectric FET can also be formed on N-type substrate with P-type source and drain regions. Though mention is made of a single dielectric buffer layer, this layer could be composed of multiple layers without departing from the invention. Though specific bias voltages are described in the foregoing description, other voltage values can be utilized without departing from the present invention. Accordingly, the present invention embraces all such alternatives, modifications, and variances that fall within the scope of the appended claims.

What is claimed is:

1. A method for the non-volatile storage of two data bits in a single FET transistor comprising:
   providing a field effect transistor (FET) having gate, drain, source, and substrate terminals, and having a first ferroelectric region between the gate and the source and second ferroelectric region between the gate and the drain;
   applying a positive voltage greater than a coercive voltage between the gate and the source to polarize said first ferroelectric region to a first state;
   applying a negative voltage greater than the coercive voltage between the gate and source to polarize said first ferroelectric region to a second state;
   applying a positive voltage greater than the coercive voltage between the gate and the drain to polarize said second ferroelectric region to the first state;

applying a negative voltage greater than the coercive voltage between the gate and the drain to polarize said second ferroelectric region to the second state;

applying a positive voltage less than the coercive voltage on the gate, ground potential on the source, and a positive voltage no greater than the gate voltage on the drain to detect the polarization state of said first ferroelectric region, a high current between source and drain indicating the first state and a low current between source and drain indicating the second state; and applying a positive voltage less than the coercive voltage on the gate, ground potential on the drain, and a positive voltage no greater than the gate voltage on the source to detect the polarization state of said second ferroelectric region, a high current between source and drain indicating the first state and a low current between source and drain indicating the second state.

2. A non-volatile memory storage method comprising:

providing an array of field effect transistors (FETs), wherein each FET in the array has a gate, drain, source, and substrate terminals, a first ferroelectric region between the gate and the source, and a second ferroelectric region between the gate and the drain, wherein the array is arranged in rows and columns, the gates of the FETs in a same row being coupled to a word line, the sources of FETs in a same column being coupled to a source bit line, and the drains of FETs in a same column being coupled to a drain bit line;

applying a positive voltage to a selected word line, a negative voltage on a selected source bit line, ground potential on unselected word lines, unselected source lines and all drain bit lines such that a voltage greater than a coercive voltage is applied between the selected word line and selected source line, but a voltage less than the coercive voltage is applied between unselected word lines and selected source bit lines, between unselected word lines and unselected source bit lines, between unselected word lines and drain bit lines, selected word lines and drain bit lines, and selected word lines and unselected source bit lines to polarize said first ferroelectric region of a selected FET to a first state while leaving the polarization of all other ferroelectric materials in the array unchanged;

applying a negative voltage to the selected word line, a positive voltage on the selected source bit line, ground potential on unselected word lines, unselected source lines and all drain bit lines such that a voltage greater than the coercive voltage is applied between the selected word line and selected source line, but a voltage less than the coercive voltage is applied between unselected word lines and selected source bit lines, between unselected word lines and unselected source bit lines, between unselected word lines and drain bit lines, selected word lines and drain bit lines, and selected word lines and unselected source bit lines to polarize said first ferroelectric region of the selected FET to a second state while leaving the polarization of all other ferroelectric materials in the array unchanged;

applying a positive voltage to the selected word line, a negative voltage on the selected drain bit line, ground potential on unselected word lines, unselected drain lines and all source bit lines such that a voltage greater than the coercive voltage is applied between the selected word line and selected drain line, but a voltage less than the coercive voltage is applied between unselected word lines and selected drain bit lines, between unselected word lines and unselected drain bit lines, between unselected word lines and source bit lines, selected word lines and source bit lines, and selected word lines and unselected drain bit lines to polarize said second ferroelectric material of the selected FET to the first state while leaving the polarization of all other ferroelectric materials in the array unchanged;

applying a negative voltage to the selected word line, a positive voltage on the selected drain bit line, ground potential on unselected word lines, unselected drain lines and all source bit lines such that a voltage greater than the coercive voltage is applied between the selected word line and selected drain line, but a voltage less than the coercive voltage is applied between unselected word lines and selected drain bit lines, between unselected word lines and unselected drain bit lines, between unselected word lines and source bit lines, selected word lines and source bit lines, and selected word lines and unselected drain bit lines to polarize said second ferroelectric material of the selected FET to second state while leaving the polarization of all other ferroelectric materials in the array unchanged;

applying a positive voltage than less the coercive voltage on the selected word line, ground potential on the selected source bit line, a positive voltage no greater than the word line voltage on the selected drain bit line, and ground potential on unselected word lines, unselected source bit lines, and unselected drain bit lines to detect the polarization state of said first ferroelectric region, a high current between the selected source bit line and the selected drain bit line indicating first state and a low current between selected source bit line and selected drain bit line indicating the second state; and applying a positive voltage than less the coercive voltage on the selected word line, ground potential on the selected drain bit line, a positive voltage no greater than the word line voltage on the selected source bit line, and ground potential on unselected word lines, unselected source bit lines, and unselected drain bit lines to detect the polarization state of said second ferroelectric region, a high current between selected drain bit line and selected source bit line indicating first state and a low current between selected drain bit line and selected source bit line indicating second state.

3. A ferroelectric field effect transistor comprising:

a source, a gate, a drain, and a channel;

a gate dielectric layer including a first ferroelectric region overlaying the channel in the vicinity of the source, a second ferroelectric region overlaying the channel in the vicinity of the drain, and a non-ferroelectric dielectric overlaying the channel between the first and second ferroelectric region; and a conductive electrode layer overlaying said gate layer.

4. A ferroelectric field effect transistor comprising a source, a gate, a drain, and a gate dielectric layer including distinct first and second ferroelectric regions that are separately polarized representing two data bits.

5. A method for the non-volatile storage of two data bits in a single FET transistor comprising:

providing a field effect transistor (FET) having a gate, drain, source, and substrate, and having a first ferroelectric region between the gate and the source and a second ferroelectric region between the gate and the drain;

selectively applying a voltage greater than a coercive voltage across the gate and the source to polarize said first ferroelectric region;

selectively applying a voltage greater than the coercive voltage across the gate and the drain to polarize said second ferroelectric region;

applying a positive voltage less than the coercive voltage on the gate, ground potential on the source, and a positive voltage no greater than the gate voltage on the drain to detect the polarization state of said first ferroelectric region; and applying a positive voltage less than the coercive voltage on the gate, ground potential on the drain, and a positive voltage no greater than the gate voltage on the source to detect the polarization state of said second ferroelectric region.

6. A non-volatile memory storage method comprising:

providing an array of field effect transistors (FETs), wherein each FET in the array has a gate, drain, source, and substrate terminals, a first ferroelectric region between the gate and the source, and a second ferroelectric region between the gate and the drain, wherein the array is arranged in rows and columns, the gates of the FETs in a same row being coupled to a word line, the sources of FETs in a same column being coupled to a source bit line, and the drains of FETs in a same column being coupled to a drain bit line;

applying a voltage greater than a coercive voltage across a selected word line and a selected source line to polarize said first ferroelectric region of a selected FET while leaving the polarization of all other ferroelectric materials in the array unchanged;

applying a voltage greater than the coercive voltage across the selected word line and a selected drain line to polarize said second ferroelectric region of the selected FET while leaving the polarization of all other ferroelectric materials in the array unchanged;

applying a positive voltage than less the coercive voltage on the selected word line, ground potential on the selected source bit line, a positive voltage no greater than the word line voltage on the selected drain bit line to detect the polarization state of said first ferroelectric region; and applying a positive voltage than less the coercive voltage on the selected word line, ground potential on the selected drain bit line, a positive voltage no greater than the word line voltage on the selected source bit line to detect the polarization state of said second ferroelectric region.

\* \* \* \* \*

UNITED STATES PATENT AND TRADEMARK OFFICE
CERTIFICATE OF CORRECTION

PATENT NO. : 6,714,435 B1
DATED : March 30, 2004
INVENTOR(S) : Klaus Dimmler and Alfred P. Gnadinger It is certified that error appears in the above-identified patent and that said Letters Patent is hereby corrected as shown below:

Column 10,
Lines 23 and 34, "than less" should be -- less than --

Column 12,
Lines 11 and 17, "than less" should be -- less than --

Signed and Sealed this

Twenty-ninth Day of June, 2004

JON W. DUDAS
*Acting Director of the United States Patent and Trademark Office*

UNITED STATES PATENT AND TRADEMARK OFFICE
CERTIFICATE OF CORRECTION

PATENT NO.    : 6,714,435 B1
DATED         : March 30, 2004
INVENTOR(S)   : Klaus Dimmler and Alfred P. Gnadinger It is certified that error appears in the above-identified patent and that said Letters Patent is hereby corrected as shown below:

Column 1,
Line 3, above the "Field of the Invention" should read:

-- STATEMENT REGARDING FEDERALLY SPONSORED RESEARCH OR DEVELOPMENT

This invention was made with Government support under contract DASG60-01-C-0046 awarded by the U.S. Army Space and Missile Defense Command. The government has certain rights in this invention. --

Signed and Sealed this

Twenty-sixth Day of October, 2004

JON W. DUDAS
*Director of the United States Patent and Trademark Office*